US009304619B2

(12) United States Patent
Day et al.

(10) Patent No.: US 9,304,619 B2
(45) Date of Patent: Apr. 5, 2016

(54) OPERATING A TOUCH SCREEN CONTROL SYSTEM ACCORDING TO A PLURALITY OF RULE SETS

(71) Applicant: Synaptics Incorporated, San Jose, CA (US)

(72) Inventors: Shawn P. Day, New Territories (HK); Roger W. Barton, Afton, MN (US); David W. Gillespie, Los Gatos, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 14/298,807

(22) Filed: Jun. 6, 2014

(65) Prior Publication Data

US 2014/0327636 A1 Nov. 6, 2014

Related U.S. Application Data

(63) Continuation of application No. 14/050,191, filed on Oct. 9, 2013, now Pat. No. 9,052,764, which is a continuation of application No. 12/770,619, filed on Apr. 29, 2010, now Pat. No. 8,564,555.

(60) Provisional application No. 61/174,403, filed on Apr. 30, 2009.

(51) Int. Cl.
*G06F 3/041* (2006.01)
*G06F 3/0486* (2013.01)
(Continued)

(52) U.S. Cl.
CPC .............. *G06F 3/041* (2013.01); *G06F 3/0416* (2013.01); *G06F 3/0486* (2013.01); *G06F 3/04886* (2013.01); *G09G 5/006* (2013.01)

(58) Field of Classification Search
CPC . G06G 3/041; G06G 3/0416; G06G 3/04886; G06G 1/3265; G06G 1/3287; G06G 1/3293
See application file for complete search history.

(56) References Cited

U.S. PATENT DOCUMENTS 4,639,720 A 1/1987 Rympalski et al.
4,680,577 A 7/1987 Straayer et al.
(Continued)

FOREIGN PATENT DOCUMENTS

CN 2653589 Y 11/2004
CN 1567140 A 1/2005
(Continued)

OTHER PUBLICATIONS

"The iPod touch—Features Guide," (Published May 10, 2008 by Apple Corporation).*
(Continued)

*Primary Examiner* — Sanjiv D Patel

(57) ABSTRACT

A touch screen control system communicates with a host processing system (HPS). The touch screen control system includes a memory and control circuitry. The control circuitry operates a touch screen according to rules stored in the memory by: during a first time period and in response to detecting a first type of user input with a touch sensor of the touch screen, updating a display screen of the touch screen autonomously without requiring intervention from the HPS following the detection of the first type of user input; during the first time period and in response to detecting a second type of user input with the touch sensor, updating the display screen according to directions provided by the HPS; and during a second time period and in response to detecting the first type of user input with the touch sensor, updating the display screen according to directions provided by the HPS.

20 Claims, 11 Drawing Sheets

(51) Int. Cl.
*G06F 3/0488* (2013.01)
*G09G 5/00* (2006.01)

(56) References Cited

U.S. PATENT DOCUMENTS

| | | |
|---|---|---|
| 4,733,222 A | 3/1988 | Evans |
| 4,763,356 A | 8/1988 | Day, Jr. et al. |
| 4,806,709 A | 2/1989 | Evans |
| 5,250,929 A | 10/1993 | Hoffman et al. |
| 5,274,363 A | 12/1993 | Koved et al. |
| 5,305,017 A | 4/1994 | Gerpheide |
| 5,307,055 A | 4/1994 | Baskin et al. |
| 5,374,787 A | 12/1994 | Miller et al. |
| 5,420,936 A | 5/1995 | Fitzpatrick et al. |
| 5,457,289 A | 10/1995 | Huang et al. |
| 5,521,596 A | 5/1996 | Selker et al. |
| 5,543,588 A | 8/1996 | Bisset et al. |
| 5,543,591 A | 8/1996 | Gillespie et al. |
| 5,550,968 A | 8/1996 | Miller et al. |
| 5,559,961 A | 9/1996 | Blonder |
| 5,598,523 A | 1/1997 | Fujita |
| 5,600,800 A | 2/1997 | Kikinis et al. |
| 5,612,719 A | 3/1997 | Beernink et al. |
| 5,638,501 A | 6/1997 | Gough et al. |
| 5,666,113 A | 9/1997 | Logan |
| 5,714,978 A | 2/1998 | Yamanaka et al. |
| 5,724,069 A | 3/1998 | Chen |
| 5,729,219 A | 3/1998 | Armstrong et al. |
| 5,730,602 A | 3/1998 | Gierhart et al. |
| 5,748,184 A | 5/1998 | Shieh |
| 5,748,185 A | 5/1998 | Stephan et al. |
| 5,764,218 A | 6/1998 | Della et al. |
| 5,764,222 A | 6/1998 | Shieh |
| 5,790,104 A | 8/1998 | Shieh |
| 5,808,605 A | 9/1998 | Shieh |
| 5,812,118 A | 9/1998 | Shieh |
| 5,821,933 A | 10/1998 | Keller et al. |
| 5,825,352 A | 10/1998 | Bisset et al. |
| 5,831,664 A | 11/1998 | Wharton et al. |
| 5,835,079 A | 11/1998 | Shieh |
| 5,841,849 A | 11/1998 | Macor |
| 5,844,547 A | 12/1998 | Minakuchi et al. |
| 5,856,822 A | 1/1999 | Du et al. |
| 5,856,824 A | 1/1999 | Shieh |
| 5,870,083 A | 2/1999 | Shieh |
| 5,874,948 A | 2/1999 | Shieh |
| 5,880,411 A | 3/1999 | Gillespie et al. |
| 5,896,126 A | 4/1999 | Shieh |
| 5,907,327 A | 5/1999 | Ogura et al. |
| 5,923,307 A | 7/1999 | Hogle, IV |
| 5,943,052 A | 8/1999 | Allen et al. |
| 5,949,643 A | 9/1999 | Batio |
| 5,952,998 A | 9/1999 | Clancy et al. |
| 5,966,122 A | 10/1999 | Itoh |
| 6,002,395 A | 12/1999 | Wagner et al. |
| 6,005,549 A | 12/1999 | Forest |
| 6,028,959 A | 2/2000 | Wang et al. |
| 6,037,929 A | 3/2000 | Ogura et al. |
| 6,084,584 A | 7/2000 | Nahi et al. |
| 6,121,960 A | 9/2000 | Carroll et al. |
| 6,144,358 A | 11/2000 | Narayanaswamy et al. |
| 6,154,194 A | 11/2000 | Singh |
| 6,191,758 B1 | 2/2001 | Lee |
| 6,209,104 B1 | 3/2001 | Jalili |
| 6,211,856 B1 | 4/2001 | Choi et al. |
| 6,226,237 B1 | 5/2001 | Chan et al. |
| 6,252,563 B1 | 6/2001 | Tada et al. |
| 6,262,717 B1 | 7/2001 | Donohue et al. |
| 6,297,945 B1 | 10/2001 | Yamamoto |
| 6,298,146 B1 | 10/2001 | Ilan et al. |
| 6,298,147 B1 | 10/2001 | Ilan et al. |
| 6,304,261 B1 | 10/2001 | Shields et al. |
| 6,327,482 B1 | 12/2001 | Miyashita |
| 6,337,918 B1 | 1/2002 | Holehan |
| 6,346,935 B1 | 2/2002 | Nakajima et al. |
| 6,351,634 B1 | 2/2002 | Shin |
| 6,360,004 B1 | 3/2002 | Akizuki |
| 6,396,483 B1 | 5/2002 | Hiller |
| 6,400,836 B2 | 6/2002 | Senior |
| 6,408,301 B1 | 6/2002 | Patton et al. |
| 6,414,674 B1 | 7/2002 | Kamper et al. |
| 6,414,675 B1 | 7/2002 | Shen |
| 6,421,453 B1 | 7/2002 | Kanevsky et al. |
| 6,424,332 B1 | 7/2002 | Powell |
| 6,424,338 B1 | 7/2002 | Anderson |
| 6,429,846 B2 | 8/2002 | Rosenberg et al. |
| 6,466,202 B1 | 10/2002 | Suso et al. |
| 6,476,797 B1 | 11/2002 | Kurihara et al. |
| 6,496,122 B2 | 12/2002 | Sampsell |
| 6,504,530 B1 | 1/2003 | Wilson et al. |
| 6,509,847 B1 | 1/2003 | Anderson |
| 6,519,283 B1 | 2/2003 | Cheney et al. |
| 6,523,079 B2 | 2/2003 | Kikinis et al. |
| 6,535,749 B1 | 3/2003 | Iwata et al. |
| 6,538,880 B1 | 3/2003 | Kamijo et al. |
| 6,545,669 B1 | 4/2003 | Kinawi et al. |
| 6,559,830 B1 | 5/2003 | Hinckley et al. |
| 6,560,612 B1 | 5/2003 | Yamada et al. |
| 6,563,939 B1 | 5/2003 | Chai |
| 6,583,770 B1 | 6/2003 | Antila et al. |
| 6,587,093 B1 | 7/2003 | Shaw et al. |
| 6,639,584 B1 | 10/2003 | Li |
| 6,668,081 B1 | 12/2003 | Ilan et al. |
| 6,670,950 B1 | 12/2003 | Chin et al. |
| 6,686,931 B1 | 2/2004 | Bodnar |
| 6,718,518 B1 | 4/2004 | Plow et al. |
| 6,721,738 B2 | 4/2004 | Verplaetse et al. |
| 6,728,812 B1 | 4/2004 | Kato |
| 6,732,278 B2 | 5/2004 | Baird, III et al. |
| 6,735,695 B1 | 5/2004 | Gopalakrishnan et al. |
| 6,738,049 B2 | 5/2004 | Kiser et al. |
| 6,741,266 B1 | 5/2004 | Kamiwada et al. |
| 6,757,002 B1 | 6/2004 | Oross et al. |
| 6,765,557 B1 | 7/2004 | Segal et al. |
| 6,785,667 B2 | 8/2004 | Orbanes et al. |
| 6,792,480 B2 | 9/2004 | Chaiken et al. |
| 6,806,867 B1 | 10/2004 | Arruda et al. |
| 6,819,961 B2 | 11/2004 | Jacobs et al. |
| 6,822,640 B2 | 11/2004 | Derocher |
| 6,828,992 B1 | 12/2004 | Freeman et al. |
| 6,842,795 B2 | 1/2005 | Keller |
| 6,850,780 B1 | 2/2005 | Gioscia et al. |
| 6,871,782 B2 | 3/2005 | Keronen et al. |
| 6,874,683 B2 | 4/2005 | Keronen et al. |
| 6,882,299 B1 | 4/2005 | Allport |
| 6,882,337 B2 | 4/2005 | Shetter |
| 6,919,864 B1 | 7/2005 | Macor |
| 6,943,774 B2 | 9/2005 | Horiki |
| 6,954,804 B2 | 10/2005 | Lam et al. |
| 7,010,145 B1 | 3/2006 | Haruki et al. |
| 7,030,837 B1 | 4/2006 | Vong et al. |
| 7,030,860 B1 | 4/2006 | Hsu et al. |
| 7,054,965 B2 | 5/2006 | Bell et al. |
| 7,068,260 B2 | 6/2006 | Hill |
| 7,068,499 B2 | 6/2006 | Aisenberg |
| 7,075,540 B2 | 7/2006 | Yuasa |
| 7,154,453 B2 | 12/2006 | Numano |
| 7,219,368 B2 | 5/2007 | Juels et al. |
| 7,239,728 B1 | 7/2007 | Choi et al. |
| 7,280,087 B2 | 10/2007 | Williams et al. |
| 7,289,083 B1 | 10/2007 | Canova, Jr. |
| 7,292,206 B2 | 11/2007 | Numano |
| 7,295,199 B2 | 11/2007 | Foo et al. |
| 7,315,300 B2 | 1/2008 | Hill et al. |
| 7,324,093 B1 | 1/2008 | Gettemy et al. |
| 7,339,580 B2 | 3/2008 | Westerman et al. |
| 7,379,569 B2 | 5/2008 | Chikazawa et al. |
| 7,453,443 B2 | 11/2008 | Rytivaara et al. |
| 7,454,712 B2 | 11/2008 | Schultz |
| 7,730,401 B2 | 6/2010 | Gillespie et al. |
| 7,868,890 B2 | 1/2011 | Ludwin et al. |
| 7,907,779 B2 | 3/2011 | Kawamoto et al. |
| 7,924,271 B2 | 4/2011 | Christie et al. |
| 7,956,845 B2 | 6/2011 | Lee |

(56) References Cited

U.S. PATENT DOCUMENTS

| | | | |
|---|---|---|---|
| 8,164,575 | B2 | 4/2012 | Lin et al. |
| 8,203,527 | B2 | 6/2012 | Low et al. |
| 8,237,667 | B2 | 8/2012 | Krah |
| 8,390,578 | B2 | 3/2013 | Chino |
| 8,416,197 | B2 | 4/2013 | Feng et al. |
| 8,564,555 | B2 | 10/2013 | Day et al. |
| 8,780,056 | B2 | 7/2014 | Yamamoto et al. |
| 9,052,764 | B2 | 6/2015 | Day et al. |
| 2001/0011308 | A1 | 8/2001 | Clark et al. |
| 2001/0028366 | A1 | 10/2001 | Ohki et al. |
| 2001/0029410 | A1 | 10/2001 | Obradovich |
| 2001/0048743 | A1 | 12/2001 | Machida et al. |
| 2001/0054968 | A1 | 12/2001 | Yoshii et al. |
| 2002/0067346 | A1 | 6/2002 | Mouton |
| 2002/0087225 | A1 | 7/2002 | Howard |
| 2002/0130841 | A1 | 9/2002 | Scott |
| 2002/0191029 | A1 | 12/2002 | Gillespie et al. |
| 2003/0006942 | A1 | 1/2003 | Searls et al. |
| 2003/0071851 | A1 | 4/2003 | Unger et al. |
| 2003/0074566 | A1 | 4/2003 | Hypponen |
| 2003/0197687 | A1 | 10/2003 | Shetter |
| 2004/0099400 | A1 | 5/2004 | Tsuzuki et al. |
| 2004/0119763 | A1 | 6/2004 | Mizobuchi et al. |
| 2004/0230807 | A1 | 11/2004 | Baird, III et al. |
| 2004/0239646 | A1 | 12/2004 | Wang |
| 2005/0024341 | A1 | 2/2005 | Gillespie et al. |
| 2005/0099400 | A1 | 5/2005 | Lee |
| 2005/0146511 | A1 | 7/2005 | Hill et al. |
| 2005/0184993 | A1 | 8/2005 | Ludwin et al. |
| 2005/0185002 | A1 | 8/2005 | Kitsugi et al. |
| 2005/0248543 | A1 | 11/2005 | North et al. |
| 2006/0066601 | A1 | 3/2006 | Kothari et al. |
| 2006/0250375 | A1 | 11/2006 | Liou et al. |
| 2006/0262146 | A1 | 11/2006 | Koivisto et al. |
| 2007/0016876 | A1* | 1/2007 | Schultz ............... G06F 9/4443 715/802 |
| 2007/0177801 | A1 | 8/2007 | Kawamoto et al. |
| 2007/0285428 | A1* | 12/2007 | Foster ..................... G06F 3/14 345/503 |
| 2008/0042978 | A1 | 2/2008 | Perez-Noguera |
| 2008/0055256 | A1* | 3/2008 | Kwong ............ G06F 3/04886 345/173 |
| 2008/0088592 | A1 | 4/2008 | Fry |
| 2008/0158177 | A1 | 7/2008 | Wilson et al. |
| 2008/0165133 | A1 | 7/2008 | Blumenberg et al. |
| 2008/0165140 | A1 | 7/2008 | Christie et al. |
| 2008/0180399 | A1 | 7/2008 | Cheng |
| 2008/0225009 | A1 | 9/2008 | Wang |
| 2008/0309636 | A1 | 12/2008 | Feng et al. |
| 2008/0313568 | A1 | 12/2008 | Park et al. |
| 2009/0051660 | A1 | 2/2009 | Feland, III et al. |
| 2009/0191029 | A1 | 7/2009 | Lim et al. |
| 2009/0207154 | A1 | 8/2009 | Chino |
| 2009/0251427 | A1 | 10/2009 | Hung et al. |
| 2009/0251430 | A1 | 10/2009 | Hung et al. |
| 2009/0309851 | A1 | 12/2009 | Bernstein |
| 2009/0315826 | A1* | 12/2009 | Lin .................. G06F 3/04883 345/157 |
| 2009/0322410 | A1 | 12/2009 | David et al. |
| 2009/0327978 | A1 | 12/2009 | Hamadene et al. |
| 2010/0059295 | A1 | 3/2010 | Hotelling et al. |
| 2010/0060593 | A1 | 3/2010 | Krah |
| 2010/0085280 | A1 | 4/2010 | Lambert et al. |
| 2010/0110029 | A1* | 5/2010 | Yamamoto ........... G06F 3/0412 345/173 |
| 2010/0115303 | A1 | 5/2010 | Stedman et al. |
| 2010/0122195 | A1 | 5/2010 | Hwang |
| 2010/0277505 | A1 | 11/2010 | Ludden et al. |
| 2011/0012856 | A1 | 1/2011 | Maxwell et al. |

FOREIGN PATENT DOCUMENTS

| | | |
|---|---|---|
| CN | 1614545 A | 5/2005 |
| CN | 1734392 A | 2/2006 |
| DE | 19654684 A1 | 7/1998 |
| EP | 262991 A2 | 4/1988 |
| EP | 546704 A2 | 6/1993 |
| EP | 660218 A1 | 6/1995 |
| EP | 725331 A1 | 8/1996 |
| EP | 807879 A2 | 11/1997 |
| EP | 896308 A1 | 2/1999 |
| EP | 898223 A2 | 2/1999 |
| EP | 911720 A1 | 4/1999 |
| EP | 984351 A2 | 3/2000 |
| EP | 1003130 A2 | 5/2000 |
| EP | 1531387 A2 | 5/2005 |
| GB | 2302429 A | 1/1997 |
| GB | 2338148 A | 12/1999 |
| JP | 61234419 A | 10/1986 |
| JP | 62078621 A | 4/1987 |
| JP | 02127720 A | 5/1990 |
| JP | 05341877 A | 12/1993 |
| JP | 06051907 A | 2/1994 |
| JP | 06241718 A | 9/1994 |
| JP | 07295747 A | 11/1995 |
| JP | 08036479 A | 2/1996 |
| JP | 09026832 A | 1/1997 |
| JP | 09101842 A | 4/1997 |
| JP | 10-357263 | 12/1998 |
| JP | 11-079000 | 3/1999 |
| JP | 2000339097 | 12/2000 |
| KR | 10-0593982 | 6/2006 |
| KR | 100593982 B1 | 6/2006 |
| KR | 10-2009-0029518 | 3/2009 |
| KR | 1020090029518 A | 3/2009 |
| WO | 9105327 A1 | 4/1991 |
| WO | 9512843 A2 | 5/1995 |
| WO | 9641329 A1 | 12/1996 |
| WO | 9722107 A1 | 6/1997 |
| WO | 9744946 A1 | 11/1997 |
| WO | 9745794 A1 | 12/1997 |
| WO | 9921077 A1 | 4/1999 |
| WO | 9931649 A1 | 6/1999 |
| WO | 0127868 A1 | 4/2001 |
| WO | 02/052506 A1 | 7/2002 |

OTHER PUBLICATIONS

"The iPhone is a Breakthrough Handheld Computer," by Walter S Mossberg and Katherine Boehret, Published Jun. 26, 2007.*

Office Action, U.S. Appl. No. 14/050,191, mailed Aug. 27, 2014, 22 pages.

Office Action, U.S. Appl. No. 14/050,191, mailed Jun. 30, 2014, 6 pages.

Creating Low-cost Intelligent Display Modules with an FPGA and Embedded Processor, ALTRA, Inc., http://www.altera.com/literature/wp/wp-01074-creating-low-cost-intelligent-display-modules-with-fpga.pdf., 2008.

Implementing a Cost-Effective Human-Machine Interface for Home Appliances, ALTERA, Inc., http://www.altera.com/literature/wp/wp-01083-cost-effective-hmi-home-appliances.pdf, Jul. 2009.

Leineweber, Hubert, Extended Search Report for European Application No. 10 77 0371, 11 pages, Oct. 14, 2013.

Leineweber, Hubert, Extended Search Report for European Application No. 10 77 0378, 12 pages, Oct. 14 2013.

Office Action Search Report, CN Application No. 201080019329.2, mailed Nov. 22, 2013, 2 pages.

Office Action, U.S. Appl. No. 14/050,191, mailed Apr. 9, 2014, 17 pages.

Office Action, U.S. Appl. No. 14/050,191, mailed Dec. 3, 2013, 39 pages.

"Section II. Memory Standard Overviews", Altera, Inc., http://www.altera.com/literature/hb/external-memory/emi_intro_over.pdf, Jan. 2010.

"Users Guide to QuBit", QuVis, Inc., Edition 1.0, 1999, 1-58.

"Using FPGAs to Render Graphics and Drive LCD Interfaces", Altera, Inc., http://www.altera.com/literature/wp/wp-01100-graphic-lcd-display.pdf, Apr. 2009.

(56) References Cited

OTHER PUBLICATIONS

Altera Corporation, , "Creating Low-Cost Intelligent Display Modules With an FPGA and Embedded Processor", http://www.altera.com/literature/wp/wp-01074-creating-low-cost-intelligent-display-modules-with-fpga.pdf Ver. 1.0, Sep. 2008, 1-5.

Altera Corporation, "Implementing a Cost-Effective Human-Machine Interface for Home Appliances", http://www.altera.com/literature/wp/wp-01083-cost-effective-hmi-home-appliances.pdf Ver. 2.0, Jul. 2009, 1-8.

Altera Corporation, "Memory Standard Overviews", http://www.altera.com/literature/hb/external-memory/emi_intro_over.pdf, Jan. 2010, 1-32.

Altera Corporation, "Using FPGAs to Render Graphics and Drive LCD Interfaces", http://www.altera.com/literature/wp/wp-01100-graphic-lcd-display.pdf Ver. 1.0, Apr. 2009, 1-9.

Bier, Eric et al., "Toolglass and Magic Lenses: The See-Through Interface", ACM-0-89791-601, 1993, 73-80.

Kim, et al., "ISSCC 2010 Session 6 Displays & Biomedical Devices, 6.1", https://submissions.miracd.com/ISSCC2010/WebAP/PDF/AP_Session6.pdf, 2010, Section 6.1.

Kim, H. et al., "A Mobile-Display-Driver IC Embedding a Capacitive-Touch-Screen Controller System", ISSCC 2010 Session 6 Displays & Biomedical Devices, 6.1 Samsung Electronics, Yongin, Korea; 978-1-4244-6034-2/10 (https://submissions.miracd.com/ISSCC2010/WebAP/PDF/AP_Session6.pdf), 2010.

Lehrbaum, R. et al., "Overview of Gateways "Connected Home" Initiative", Http://www.linuxdevices.com/articles/AT3155528116.html, Nov. 15, 2000, 1-4.

Neale, R. , "Laptops and notepads—the arrival of the second display", Electronic Engineering, Oct. 2000, 9-10.

Tsukada, Y. et al., "Layered Touch Panel: The input device with two touch panel layers", Conference on Human Factors in computing systems CHI '02 extended abstracts on Human Factors in computing systems, 2002, 1-2.

\* cited by examiner

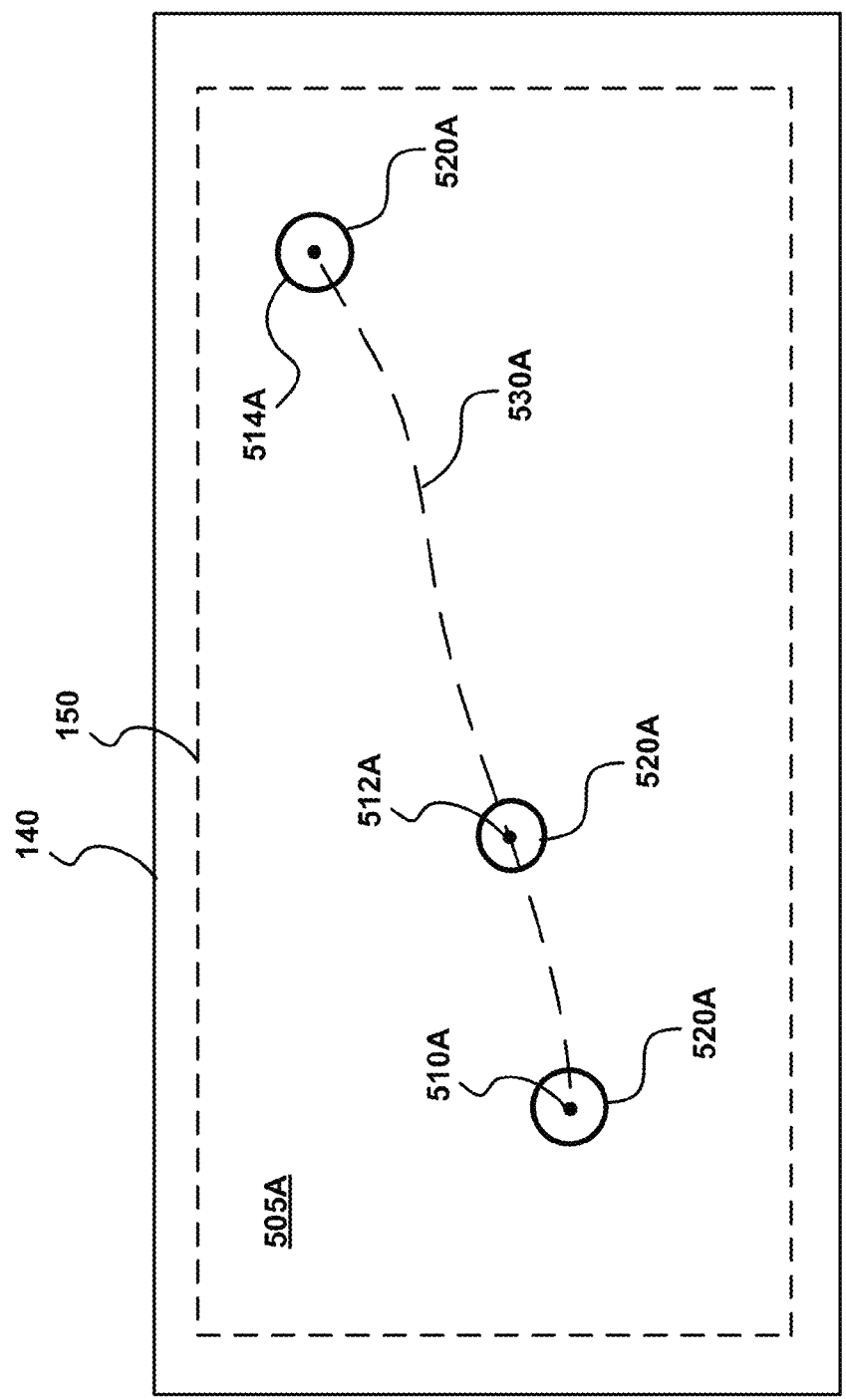

OPERATING A TOUCH SCREEN CONTROL SYSTEM ACCORDING TO A PLURALITY OF RULE SETS

CROSS-REFERENCE TO RELATED U.S. APPLICATIONS

Continuation

This application is a continuation application of and claims the benefit of U.S. patent application Ser. No. 14/050,191 filed on Oct. 9, 2013, entitled "OPERATING A TOUCH SCREEN CONTROL SYSTEM ACCORDING TO A PLURALITY OF RULE SETS," by Shawn P. Day et al., assigned to the assignee of the present application, and hereby incorporated by reference herein in its entirety.

U.S. patent application Ser. No. 14/050,191 was a continuation application of and claimed the benefit of U.S. patent application Ser. No. 12/770,619, filed on Apr. 29, 2010, entitled "OPERATING A TOUCH SCREEN CONTROL SYSTEM ACCORDING TO A PLURALITY OF RULE SETS," by Shawn P. Day et al., and assigned to the assignee of the present application; U.S. patent application Ser. No. 12/770,619 was incorporated by reference in its entirety into U.S. patent application Ser. No. 14/050,191.

U.S. patent application Ser. No. 12/770,619 claimed priority to and benefit of U.S. Provisional Application 61/174,403 filed Apr. 30, 2009, entitled "REDUCING LATENCY ASSOCIATED WITH INTERACTIONS WITH A TOUCH SCREEN DEVICE," by Shawn P. Day et al.; and also incorporated provisional application 61/174,403 by reference in its entirety

BACKGROUND

Electronic devices are ubiquitous in today's society. As the technology of electronic devices advances, the number of integrated functions enabled on such devices also increases. As an example, many of today's electronic devices include the ability to display information to users and to receive touch based input from users. In order to receive and process touch based input, many current electronic devices utilize capacitive sensing devices in combination with display devices. Typically such capacitive sensing devices process user input received from, for example, one or more fingers, styli, or other object in a sensing region of the capacitive sensor device.

However, as the number of integrated functions increases on electronic devices, the processing burdens imposed on their host processors also increase. (As an example, when an electronic device includes both a display and a capacitive sensor device, the host processor of the electronic device handles processing for both components.) As a result, the electronic devices may suffer from performance shortcomings due to the burden placed on their host processors. For example, a delay between user input and visual feedback to the user may arise because of host processor-induced latency.

As a result of such shortcomings, users may become frustrated and/or confused. User frustration or confusion may lead to user dissatisfaction or cause the users to perform repetitive and/or unnecessary user input actions which further burden the host processors. Additionally, as the number of the functions integrated onto electronic devices increases, power consumption also increases.

Taking mobile devices as a specific example, the use of mobile devices often require loading, displaying and controlling large amounts of data including pictures, web pages, maps, text and non-textual documents, etc. In some mobile devices, there is often a delay between user input (e.g. taps, double-taps, scroll commands, etc.) and visual feedback to the user.

The drawings referred to in this description should be understood as not being drawn to scale except if specifically noted.

DESCRIPTION OF EMBODIMENTS

Reference will now be made in detail to embodiments of the present invention, examples of which are illustrated in the accompanying drawings. While the invention will be described in conjunction with various embodiment(s), it will be understood that the descriptions are not intended to limit the present invention to these embodiments. On the contrary, the present invention is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present invention. However, the present invention may be practiced with a subset or without these specific details. In other cases, well known methods, procedures, components, and circuits have not been described in detail as not to unnecessarily obscure aspects of the present embodiments.

Description of Components

Figure 1:
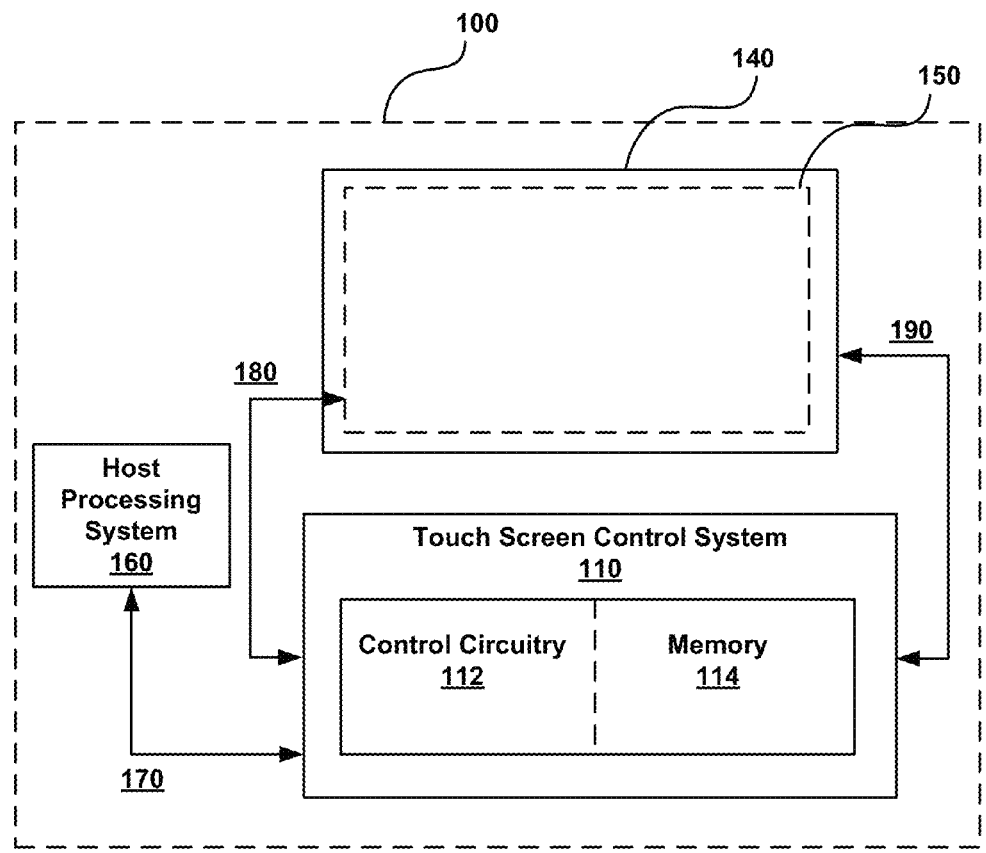
FIG. 1 illustrates an example of an electronic device, in accordance with an embodiment of the present invention.

FIG. 1 depicts electronic device 100, in accordance with an embodiment of the present invention. Electronic device 100 includes touch screen control system (TSCS) 110 (which includes control circuitry 112 and memory 114). Connecting arrows 170, 180, and 190 indicate that, in some embodiments, host processing system 160 has bidirectional interactions with TSCS 110, TSCS 110 has bidirectional interactions with touch sensor 150, and TSCS 110 has bidirectional interactions with display screen 140. In other embodiments, some or all of these interactions may be unidirectional.

In various embodiments, electronic device 100 is any electronic device that comprises the aforementioned components and functions (e.g., receives user input and updates a display screen). For example, electronic device 100 may comprise: personal computers (e.g. desktop computers, laptop computers, portable computers, workstations, personal digital assistants, and video game machines), communication devices (e.g. wireless phones, pagers, and other messaging devices), media devices that record and/or play various forms of media (e.g. televisions, cable boxes, music players, digital picture frames, video players, digital cameras, and video cameras), peripherals to larger systems (e.g. printers, keyboards, and remote controls), white goods (e.g. appliances), automotive devices, industrial devices, electronic toys, and any other electrical device that could benefit from having a sophisticated user interface that does not significantly burden its host processing system.

In some embodiments, elements of electronic device 100 are physically unified, and TSCS 110, display screen 140, touch sensor 150, and host processing system 160 are all disposed within a common housing. For example, electronic device 100 may be a handheld computing system.

Display screen 140 is configured for displaying images. Display screen 140 may be a cathode ray tube (CRT), a liquid crystal display (LCD), an organic light emitting diode (OLED) display, an electroluminescent display, or any other type of display screen suitable to be integrated in an electronic device. Additionally, in some embodiments, electronic device 100 includes a backlight (not shown) to enhance visibility of images on display screen 140.

Touch sensor 150 is shown in FIG. 1 as a dotted rectangle overlapping display screen 140. However, in various embodiments, the actual physical sensor components of touch sensor 150 may be located inside or outside of the dotted rectangle.

Although called a "touch" sensor, embodiments of touch sensor 150 may respond to contact or non-contact user input in their respective sensing regions. The sensing region overlaps with an active area of display screen 140. The active area is the region in which electronic images may be displayed by display screen 140. It will be understood that some embodiments of display screen 140 may include regions, such as border regions, in which electronic images may not be displayed.

Embodiments of touch sensor 150 may demark their sensing regions using surfaces. During operation, touch sensor 150 is operated to detect one or more input objects in the sensing region, for sensing user input. "Sensing region" as used herein is intended to broadly encompass any space where touch sensor 150 is able to reliably detect an input object. In some embodiments of touch sensor 150, the sensing region extends from a surface of touch sensor 150 in one or more directions into space until decreased signal-to-noise prevents accurate object detection. This distance may be on the order of less than a millimeter, millimeters, centimeters, or more, and may vary significantly with the type of sensing technology used and the accuracy desired. Thus, embodiments may require contact with the surface, either with or without applied pressure, while others do not. Accordingly, in some embodiments, the planarity, size, shape and exact locations of the particular sensing regions vary widely from embodiment to embodiment.

Touch sensor 150 may utilize any combination of sensor components and sensing technologies. As several non-limiting examples, touch sensor 150 may use capacitive, elastive, resistive, inductive, surface acoustic wave, optical, or other techniques. Data gathered by touch sensor 150 may be used to determine the presence, location and/or motion of one or more fingers, styli, and/or other objects.

In some resistive implementations of touch sensor 150, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of touch sensor 150, one or more sensor elements pick up loop currents induced by a resonating coil or pair of coils. Some combination of the magnitude, phase, and frequency to determine positional information.

In some capacitive implementations of touch sensor 150, voltage or current is applied to create an electric field. Nearby input objects caused changes in capacitive coupling that may detect be detected as changes in voltage, current, or the like.

Some capacitive implementations utilize arrays or other patterns of capacitive sensor electrodes to create electric fields. Some capacitive implementations utilize resistive sheets, which may be uniformly resistive.

Some capacitive implementations utilize "self capacitance" (also "absolute capacitance") sensing methods based on the capacitive coupling between sensor electrodes and free space. In one implementation, an absolute capacitance sensing method operates by modulating sensor electrodes with respect to a reference voltage (e.g. system ground), and by detecting the capacitive coupling between sensor electrodes and input objects.

Some capacitive implementations utilize "mutual capacitance" (also "transcapacitance") sensing methods based on the capacitive coupling between sensor electrodes. In one implementation, a transcapacitive sensing method operates by detecting the capacitive coupling between one or more transmitting electrodes and one or more receiving electrodes. Transmitting sensor electrodes may be substantially modulated relative to a reference voltage (e.g. system ground) to facilitate transmission, and receiving sensor electrodes may be held substantially constant relative to the reference voltage to facilitate receipt. Sensor electrodes may be dedicated transmitters or receivers, or transmit as well as receive.

Host processing system 160 may be utilized for processing images for display on display screen 140. For example, to display video on display screen 140 in some embodiments, host processing system 160 provides image data for the video frames, such that display screen 140 may present the video to users.

In some embodiments, host processing system 160 is configured for primary processing of the images for display on display screen 140. That is, host processing system 160 is configured to perform a majority of the processing of images for display on display screen 140. In other words, in some embodiments, electronic device 100 is designed such that a majority of image data to be display on display screen 140 would pass through and be processed by host processing system 160. However, in some embodiments, host processing system 160 is not configured for primary processing of the images for display on display screen 140, and host processing system 160 does little or no processing of the images for display on display screen 140.

A "primary image" is an image processed by a host processing system and held in a memory of a touch screen control system TSCS 110 (e.g. a memory that may be separate from or be part or memory 114) for primary display on display screen 140. The primary image may be static or may change over a period of time. In some embodiments, the primary image is modified, or replaced entirely by host processing system 160, by TSCS 110, or by both.

An image is "updated" in memory when the data representing the image is changed in part or in whole. In some embodiments, host processing system 150 or TSCS 110 (e.g. using control circuitry 112) changes bits associated with the changed portion(s), or writes new image data to replace what is stored in the memory.

An image is "updated" on display screen 140 when the display of the image by display screen 140 is changed in part or in whole. In some embodiments, TSCS 110 (e.g. using control circuitry 112) changes one or more portions of an image displayed on display screen 140, or replaces the image displayed on display screen 140 entirely.

"Display image update rate" as used herein generally indicates the rate at which the image on display screen 140 is updated. For example, some typical display image update rates associated with animation or video of reasonable quality include 15, 24, and 30 frames per second. As another example, a typical display image update rate associated with quality user interface experience is 60 frames per second.

"Image data update rate" as used herein generally indicates the rate at which image data is updated in a memory of TSCS 110 (e.g. first memory 131 described below). The updating of image data in the memory of TSCS 110 may be by host processing system 160, TSCS 110, or some other element.

In various embodiments, in accordance with the present invention, TSCS 110 operates touch sensor 150 to detect user input in the sensing region and operates display screen 140 to display images in response to the user input, without requiring intervention by host processor 160. In other words TSCS 110 autonomously operate touch sensor 150 and display screen 140, without real-time host image processing performed or direction provided directly in response to the user input in the sensing region. TSCS 110 may perform these functions according to hardwired rules or with rules previously provided by host processing system 160.

In some embodiments, host processing system 160 is in sometimes a low-power state (including potentially being off) while TSCS 110 is operating autonomously. In some embodiments, host processing system 160 sometimes performs processing or provides instructions not directly related to updating display screen 140 or not directly in response to the user input.

In embodiments of electronic device 100, such autonomous operation by TSCS 110 reduces or eliminates the shortcomings as describe above. For example, such autonomous operation may reduce latency, reduce response time variability, and increase responsiveness to user input. These improvements can increase a user's sense of ease, comfort, or confidence in the operation of electronic device 100.

In embodiments of electronic device 100, such autonomous operation reduces the processing required of host processing system 160, and thus can reduce power consumption by electronic device 100. For example, host processing system 160 may enter a low power state while the updating of images on display screen 140 is done locally by TSCS 110. Examples of low power states include off states, sleep states, and states where host processing system 160 expends less processing power.

In addition, in embodiments of electronic device 100, such autonomous operation reduces the maximum image data update rate that host processing system 160 needs to support while still providing smooth and responsive feedback. For example, TSCS 110 may be configured such that it can produce images and update display screen 140 at a higher rate than host processing system 160 can update the primary image held in a memory of TSCS 110 (e.g. memory 114). In some embodiments, TSCS 110 is able to produce updated displays at 60 Hz or higher in response to user input. This offloads host processing system 160 such that host processing system 160 may be configured with a maximum update rate lower than 60 Hz (e.g., 30 Hz) without significant detrimental impact on user experience. This also allows electronic device 100 to have relaxed requirements for communications bandwidth (e.g., serial link requirements), other performance characteristics, and the like. The relaxed requirements may provide greater design choice and cost savings.

Some embodiments of electronic device 100 are able to update display screen 140 faster than host processing system 160 can update the primary image. That is, some embodiments of electronic device 100 support a display image update rate greater than the image data update rate associated with host processing system 160. For example, in some embodiments, TSCS 110 is configured to be able to generate updated images and update display screen 140 at a faster rate than if host processing system 160 performed the image processing. This TSCS 110 functionality supports the greater display image update rate in those systems.

Regardless of the maximum update rates, in operation, the image data update rate utilized may be significantly lower than display screen 140 update rate utilized. For example, TSCS 110 may blend images to provide visual feedback during a function such as a drag function (blending is discussed in further detail below). The primary image may be the "background" over which the item dragged moves, and image data held in memory for the primary image may change infrequently or not at all during the drag function. Thus, a lower image data update rate is utilized (compared to the display image update rate used) by some embodiments.

The image of the item dragged may stay static in memory during the drag function. However, the blending coordinates associated with the image of the item dragged may change during the drag function. TSCS 110 updates display screen 140 with autonomously generated images blending the image of the item dragged at locations specified by the blending coordinates, effectively moving the dragged item relative to the primary image or display screen 140, or both. Thus, a higher display image update rate is utilized (compared to the image data update rate used).

In various embodiments, TSCS 110 operates touch sensor 150 to obtain measurements that enable the determination of user input characteristics such as number and motion of input objects. Such measurement(s) are utilized by TSCS 110, in some embodiments, to determine positional information with respect to a user input relative to the sensing region of touch sensor 150.

The term "positional information" as used herein is intended to broadly encompass absolute and relative position-type information, including motion in one or more directions and also other types of spatial-domain information such as velocity, acceleration, and the like. Various forms of positional information may also include time history components, as in the case of gesture recognition and the like. The positional information from TSCS 110 may be used for facilitating a full range of interface actions, including use of the proximity sensor device as a pointing device for cursor control, scrolling, and other functions.

Elements of TSCS 110 may be implemented as part or all of one or more integrated circuits and/or discrete components physically separate from host processing system 160. That is, TSCS 110 may comprise part or all of one IC that is separate from host processing system 160. Similarly, TSCS 110 may comprise parts or all of multiple ICs that are separate from host processing system 160.

Embodiments of TSCS 110 may include computational capability that enables it to discriminate or ascertain proper responses to user input. For example, TSCS 110 may make decisions, formulate responses, or cause actions by itself. Also, TSCS 110 may respond to user input that are relevant to one or more electronic applications, without requiring constant or periodic communications with host processing system 160. Example responses include adjustments to an image being displayed.

In various embodiments, TSCS 110 comprises logic circuitry. The logic circuitry is configured to control the flow of information with host processing system 160. For example, the logic circuitry can control the flow of communication between host processing system 160 and TSCS 110. As another example, the logic circuitry can provide discriminatory or interpretive capabilities in the communications. With such configurations, the logic circuitry can reduce the frequency of interactions needed with host processing system 160 for operating display screen 140 and touch sensor 150.

The logic circuitry may comprise circuitry specifically for implementing the computational logic, general use processor circuitry programmed to perform the functions of the computational logic, or a combination thereof. For example, in some embodiments, the logic circuitry is hard wired with rules. As another example, in some embodiments, the logic circuitry comprises computational circuitry coupled with appropriate rules held in memory. The rules may comprise computer-executable code, data associating actions with conditions stored in tables or other structures, etc.

The logic implemented can be application specific. In some embodiments, this is enabled by employing different logic circuits in conjunction with different applications. In some embodiments, this is enabled by employing different rule sets held simultaneously in memory. In some further embodiments, this is enabled by loading new rules into memory.

Figure 2:
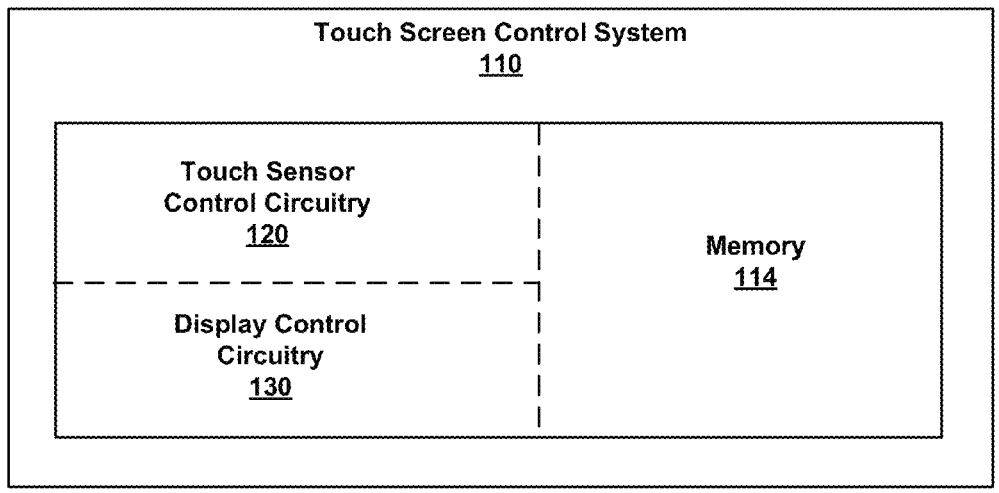
FIG. 2 illustrates an example of a touch screen control system, in accordance with an embodiment of the present invention.

FIG. 2 depicts a TSCS 110 that can be coupled with host processing system 160 (shown in FIG. 1), in accordance with an embodiment of the present invention. TSCS 110 includes TSCC (touch screen control circuitry) 120 for operating touch sensor 150, DCC (display control circuitry) 130 for operating display screen 140, and memory 114 for storing rules of operation.

As discussed above, elements of TSCS 110 may be implemented as part or all of one or more integrated circuits and/or discrete components physically separate from host processing system 160. Thus, embodiments of TSCS 110 in accordance to the present invention are well suited to having discrete components, such as ICs that each solely comprises a TSCC 120 or DCC 130, and the like. Embodiments of TSCS 110 in accordance to the present invention are also well suited to being integrated in a single IC, such as one IC that forms parts or all of TSCC 120 and DCC 130.

In some embodiments, TSCC 120 and DCC 130 do not share circuitry. That is, circuitry used to operate the touch sensor 150 is not used to operate display screen 140, and vice versa. In some embodiments, TSCC 120 and DCC 130 of control circuitry 112 do share circuitry, such that circuitry of TSCC 120 is also circuitry of DCC 130. For example, circuitry specific to operation of touch sensor 150 and circuitry specific to operation of display screen 140 may be physically coupled to a same processing unit that performs computations for both touch sensor and display operation. As another example, TSCC 120 and DCC 130 of control circuitry 112 may hold data in the same memory.

Some embodiments of the present invention provide direct communication between TSCC 120 and DCC 130. In some embodiments, this direct communication is enabled by one or more communication channels coupling discrete ICs comprising TSCC 120 and DCC 130. In some embodiments, this direct communication is enabled by integrating at least parts of TSCC 120 and DCC 130 in one IC. This direct communication reduce the duties of host processing system 160 associated with performing some touch or display tasks. TSCC 120 may send information such as touch coordinates or gesture commands to DCC 130 before or in parallel with sending them to host processing system 160.

In some embodiments, memory 114 is physically distinct from host processing system 160.

Figure 3:
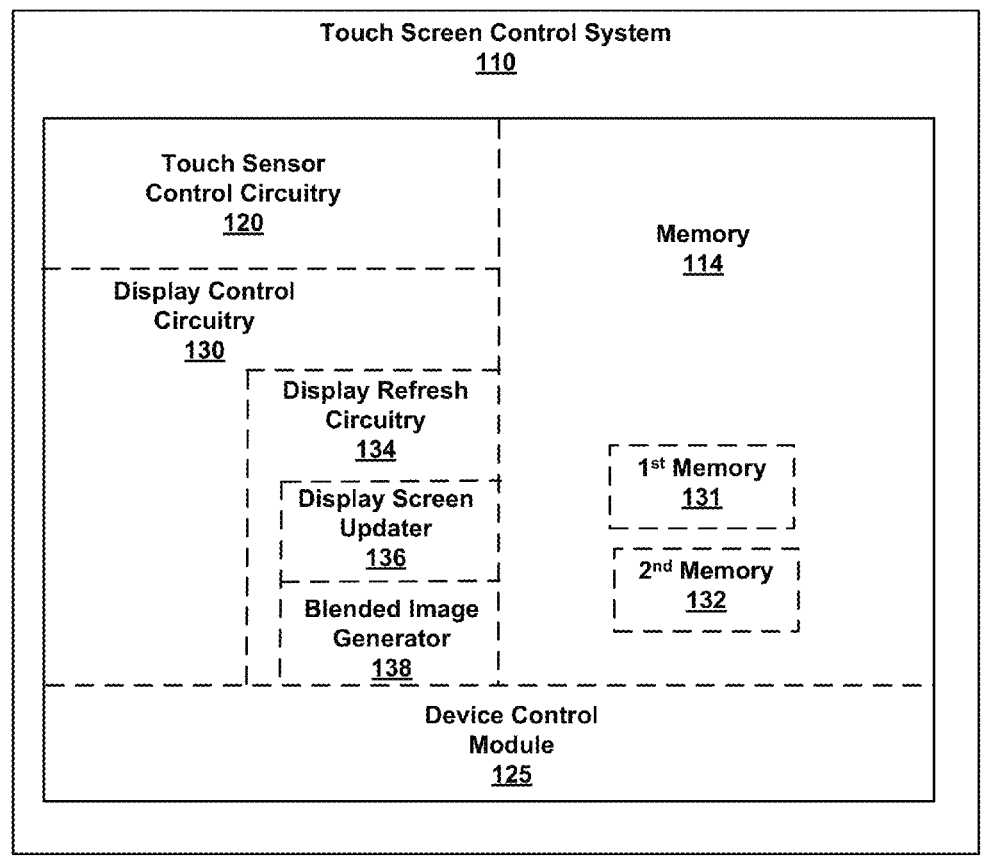
FIG. 3 illustrates another example of a touch screen control system, in accordance with an embodiment of the present invention.

FIG. 3 illustrates another example of TSCS 110, in accordance with an embodiment of the present invention, which may be coupled with host processing system 160 (shown in FIG. 1). As shown in FIG. 3, in some embodiments, TSCS 110 optionally includes a first memory 131 and a second memory 132, for storing images for display on display screen 140. In some embodiments of TSCS 110 comprising first and second memories 131 and 132, at least part of first and second memories 131 and 132 (e.g. part or all of one or both first memory 131 and second memory 132) are part of memory 114. However, in some other embodiments comprising first and second memories 131 and 132, at least part of first and second memories 131 and 132 are physically separate from memory 114. Also, first memory 131 and second memory 132 may be disposed as physically separate memory structures or be partitions of the same memory structure.

In some embodiments, second memory 132 is smaller in memory capacity than first memory 131. And, in some embodiments, first memory 131 is a frame buffer.

Also, as shown in FIG. 3, in some embodiments, DCC 130 optionally includes display refresh circuitry 134 for refreshing display screen 140 with images. Display refresh circuitry optionally includes display screen updater 136 for updating display screen 140 and blended image generator 138 for generating blended images using images stored in first memory 131 and second memory 132. Further, in some embodiments, TSCS 110 optionally includes a device control module 125 for controlling other modules.

In various embodiments, one or more of these components of TSCS 110 share circuitry with each other, and/or with another part of TSCS 110. These components, along with other parts of TSCS 110 may be implemented as part or all of one or more integrated circuits and/or discrete components.

Description of Components in Operation

Figure 4:
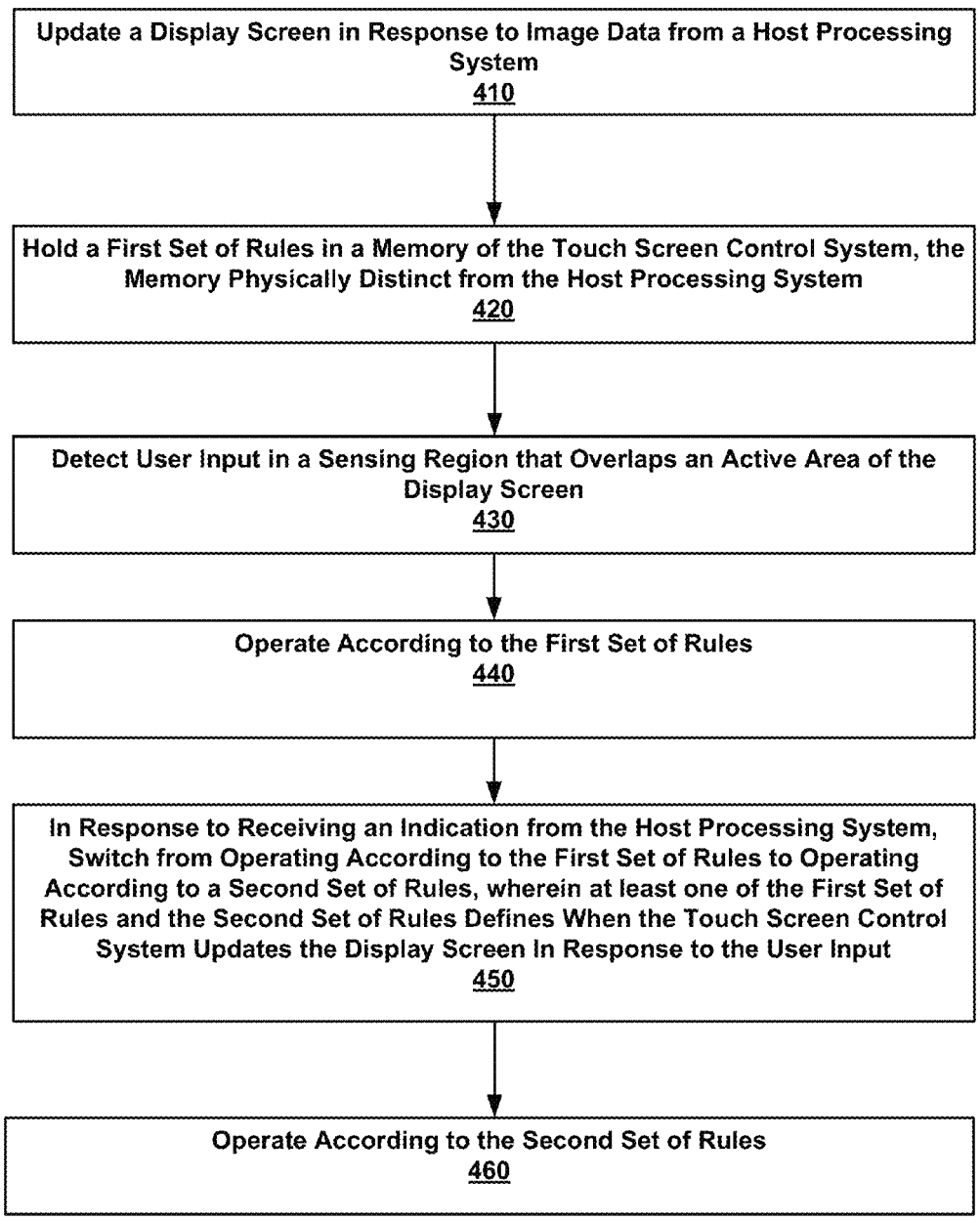
FIG. 4 illustrates an example method for operating a touch screen control system, in accordance with an embodiment of the present invention.

FIG. 4 depicts a method for operating electronic system 100 and TSCS 110 of FIG. 1 in accordance with an embodiment of the present invention. The method shown in FIG. 4 will be described in conjunction with FIGS. 5A-7B. In one embodiment, method 400 is carried out by processors and electrical components operating according to computer-readable and computer-executable code. The computer-readable and computer-executable code may reside, for example, in a data storage medium such as computer-usable volatile and non-volatile memory. However, the computer-readable and computer-executable code may reside in any type of computer-readable storage medium. In some embodiments, method 400 is performed at least by the system(s) described in FIGS. 1-3 and 5A-7B. In particular, FIGS. 5A-7B depict various embodiments of displaying images on display screen 140.

In the embodiments discussed below, control circuitry 112 is described as performing most of the operation associated with operating touch sensor 150, updating display screen 140, and communicating with host processing system 160. It is understood that, in some embodiments, other parts of TSCS 110 may perform some or all of these functions.

At 410 of method 400, display screen 140 is updated by control circuitry 112 in response to image data received from host processing system 160. For example, in one embodiment, in reference to FIG. 5A, display screen 140 is updated in response to image data from host processing system 160. Images received from host processing system 160 can comprise video frames, pictures, web pages, maps, textual and non-textual documents, etc.

At 420 of method 400, a first set of rules is held in memory 114 of TSCS 110. In general, sets of rules direct control circuitry 112 to operate in a certain manner. In various embodiments, control circuitry 112 can operate under any number of rules (e.g., a first set of rules, a second set of rules, etc.). For example, one set of rules may direct control circuitry 112 to operate in a certain manner in response to one kind of user input (e.g., a double tap in a predefined portion of the sensing region). Likewise, another set of rules may direct control circuitry 112 to operate in a different manner in response to the same kind or another kind of user input (e.g., a double tap in the same predefined portion of the sensing region, or a double tap in a different predefined portion of the sensing region).

In one embodiment, memory 114 is configured to hold a plurality of sets of rules (e.g., a first set of rules and a second set of rules) simultaneously. It should be appreciated that any number of rules or rule sets can be held simultaneously. For example, in some embodiments, the sets of rules are loaded at manufacture and held simultaneously. As another example, in various embodiments, the sets of rules are loaded by host processing system 160 at start-up, when coming out of hibernation, when waking up, when unlocking, and/or the like. As a further example, in some embodiments, the sets of rules are loaded by host processing system 160 in response to particular applications running or particular functions initiating. As yet another example, some embodiments use a combination of the above, (e.g., some rules are loaded at manufacture or at start-up, and others are loaded dynamically during operation of electronic device 100).

In some embodiments where memory 114 is configured to hold multiple rule sets, pointers or other indicators denote the active set of rules. In some embodiments where memory 114 is configured to hold multiple rule sets, a most recently loaded rule set is the active set of rules.

In another embodiment, memory 114 is configured to hold different sets of rules (e.g., a first set of rules and a second set of rules) at different times. In some embodiments, the set of rules held at any particular time is the active rule set. For example, a first set of rules can be loaded into memory 114 by host processing system 160 at a first time and be replaced by a second set of rules at a later time. The first time or the later time may be associated with shutting down or starting up, going to sleep or waking up, hibernating or coming out of hibernation, being locked or unlocked, particular applications running, particular applications having priority or focus, particular images being shown, particular operation status, a particular user logged in, etc.

In some embodiments, replacing the first set of rules with the second set of rules is in response to receiving an indication from host processing system 160, which is discussed in detail below. In one embodiment, control circuitry 112 receives the indication from host processing system 160 by receiving the second set of rules.

In some embodiments, control circuitry 112 operates touch sensor 150 to detect user input in the sensing region of touch sensor 150, which overlaps the active area of display screen 140. At 430 of method 400, user input is detected in the sensing region. For example, the user input may comprise a variety of types of user input. For example, touch sensor 150 may comprise a contactable surface, and the user input may comprise a contact with the surface meeting specific size or contact patch area considerations. As another example, the user input may comprise a non-contacting motion of a large input object in the sensing region.

At 440 of method 400, control circuitry 112 operates according to the first set of rules. For example, a first set of rules may direct control circuitry 112 to operate in a certain manner in response to a first type of user input.

At 450 of method 400, in response to receiving an indication from host processing system 160, control circuitry 112 switches from operating according to the first set of rules to operating according to a second set of rules.

At 460 of method 400, control circuitry 112 operates according to the second set of rules. For example, the second set of rules may direct control circuitry 112 to operate in a different manner in response to the first type of user input (different from the certain manner prescribed by the first set of rules).

In some embodiments, at least one of the first set of rules and the second set of rules defines when control circuitry 112 updates display screen 140 in response to the user input detected in the sensing region of touch sensor 150. "Defines when" is used here to mean "defines if" than "defines what time." For example, in some embodiments, one or both of the first and second sets of rules defines what type(s) of user input triggers an update to display screen 140. These sets of rules may or may not impose any requirements about at what time updates to display screen 140 are made.

Sets of rules may include rules from any appropriate space of potential rules. For example, sets of rules may define when control circuitry 112 autonomously updates display screen 140 in response to user input. In some embodiments, some rule sets are configured to cause control circuitry 112 to never autonomously update display screen 140 in response to user input. For example, these sets of rules may have explicit rules for not autonomously updating, or merely have no rules for autonomously updating.

In some embodiments, some rule sets are configured to cause control circuitry 112 to sometimes autonomously update display screen 140 in response to user input, such as by causing control circuitry 112 to autonomously update display screen 140 when particular conditions are met. For example, in some embodiments, some rule sets are configured to cause control circuitry to autonomously update display screen 140 in response to a first type of user input, and not in response to a second type of user input.

In some embodiments, some rule sets are configured to cause control circuitry 112 to always autonomously update display screen 140 in response to user input. For example, these sets of rules may have explicit rules for handling all types of user input, or merely have no rules for non-autonomous updating of display screen 140 (e.g. inability to act on updates by host processing system 160).

The rule sets may also define how the display screen is updated. For example, sets of rules can also define which graphical elements are updated, at what time the graphical elements are updated, and the like. For example, some rule sets may associate different images with different user inputs, and define which image to display in response to which user input. As another example, some rule sets may define what time to display the image (e.g., display the image an amount of time after receiving the user input, display the image for a duration of time, etc.). As yet another example, some rule sets may define other characteristics associated with the image (e.g. brightness, intensity, color, size, fade in/out, etc.)

Sets of rules may define when control circuitry 112 reports information about user input to host processing system 160. In some embodiments, some rule sets are configured to cause control circuitry 112 to never report information about the user input to host processing system 160. For example, these sets of rules may have explicit rules for not reporting, or merely have no rules for reporting.

In some embodiments, some rule sets are configured to cause control circuitry 112 to sometimes report information about the user input to host processing system 160, such as by causing control circuitry 112 to report information when particular conditions are met. For example, in some embodiments, some rule sets are configured to cause control circuitry 112 to report information in response to a first type of user input, and not in response to a second type of user input.

In some embodiments, some rule sets are configured to cause control circuitry 112 to always report information about the user input to host processing system 160. For example, these sets of rules may have explicit rules for always reporting, or merely have no rules for not reporting.

The rule sets may also define how the information about the user input is reported. For example, some rule sets may associate different types of signals (e.g. different bit sequences) with different user inputs, and define which signal to provide in response to which user input. As another example, some rule sets may define what time to provide the information (e.g., convey the information an amount of time after receiving the user input, report it once or repeat the report, etc.) As yet another example, some rule sets may define other reporting characteristics.

For example, in some embodiments, some rule sets may include rules from any one or combination of the following:

Regular Reporting: Rules of this type cause control circuitry 112 to make regular reports of information about user input information to host processing system 160. For example, the reporting may be triggered by a timer such that the reports are periodic. As other examples, the reporting may be triggered by counters or events unrelated to user input in the sensing region of touch sensor 150.

Report Gesture Events: Rules of this type cause control circuitry 112 to report instances of gestures to host processing system 160. Some embodiments of control circuitry 112 operating according to this type of rule analyze the user input and recognize gestures, and provide indications of those gestures to host processing system 160. For example, control circuitry 112 may recognize that two input objects have contacted a surface of touch sensor 150 for a short duration, and report the occurrence of a two-finger-tap to host processing system 160. As another example, control circuitry 112 may recognize that an input object is hovering over a location on a surface of touch sensor 150 associated with turning on keyboard function, and report a keyboard actuation input to host processing system 160.

Some embodiments of control circuitry 112 operating according to these "report gesture events" types of rules analyze the user input to determine that user input meeting particular criteria is received, and report images of the user input to host processing system 160. For example, control circuitry 112 may recognize a contact by an input object to a surface of touch sensor 150 lasting a duration longer than a reference duration, and send images of the contact to host processing system 160 for analysis by host processing system 160.

Report Selected Gestures: Rules of this type are configured to cause control circuitry 112 to report only some of a subset of gestures recognized by control circuitry 112. For example, some embodiments of control circuitry 112 operating according this type of rules report taps that occur within specific portions of the sensing region of touch sensor 150 that correspond to parts of a GUI interface shown on display screen 140, and not to report taps that occur in other portions of the sensing region. In some embodiments, the gestures are application-specific.

Report at Selected Parts of Input Sequences: Rules of this type are configured to cause control circuitry 112 to report only at particular parts of input sequences. For example, these rules may cause control circuitry 112 to report only at the start of an input sequence, the end of an input sequence, or at both the start and the end. Control circuitry 112 may operate to provide user feedback as appropriate, without intervention by host processing system 160. For example, an input sequence comprising typing on a virtual keyboard may be reported by control circuitry 112 when words or lines are completed (e.g. when the space bar or enter key is actuated), when a certain number of characters have been inputted, and the like. As another example, an input sequence tracing out a character or word may be reported by control circuitry 112 when the tracing appears complete (e.g., after a certain number of strokes, after an input object lifts from a surface of touch sensor 150, after a time out, etc.). As further examples, rules of this type may cause control circuitry 112 to report in response to selection commands (e.g., button actuation, particular types of user input in the sensing region of touch sensor 150 such as double touches, etc.). In some embodiments, control circuitry 112 report to host processing system 160 information about the input sequence (e.g., characters entered, words recognized), images of the input sequence (e.g., strokes detected), locations of touches in the input sequence, gestures sensed or recognized during the input sequence, etc.

Report Application Specific Commands: Rules of this type cause control circuitry 112 to return user input specific to particular applications. For example, rules of this type may cause control circuitry 112 to report user input information associated with changing a radio button or a slider control on a web page.

Embodiments of the present invention performing method 400 can provide low-latency visual feedback to the user that improves user experience with electronic device 100. The low-latency visual feedback to the user is facilitated by control circuitry 112 autonomously updating display screen 140 in response to user input. Additionally, power consumption by electronic device 100 is reduced and/or performance requirements of various components of electronic device 100 are relaxed.

Additionally, some rule sets are configured such that TSCS 110 (e.g., using control circuitry 112 to communicate to host processing system 160 information about user input that triggers one or more of the following events: (1) switching to a new application, (2) enabling further functions of a current application, (3) updating a memory of electronic device 100 outside of TSCS 110, such as a memory of host processing system 160, and (4) triggering telephone calls or internet access.

In various embodiments, some sets of rules (e.g., a first or second set of rules) is configured to cause control circuitry 112 to (1) autonomously update display screen 140 in response to a first type of user input (but not in response to a second type of user input) and (2) report user input information in response to the second type of user input (and not in response to the first type of user input) to host processing system 160. For example, in some embodiments, a first set of rules causes control circuitry 112 to autonomously update display screen 140 in response to a drag gesture, but not in response to a double tap gesture. As another example, in some embodiments, a first set of rules causes control circuitry 112 to report information about a drag operation at a termination of the drag operation, but not to report information about the drag operation during the drag operation.

Various ways of autonomously updating display screen 140 that do not involve real-time intervention by host processing system 160 exist. For example, some embodiments directly adjust the image stored in the frame buffer (perhaps after copying the image in the frame buffer to another location). As another example, some embodiments use an image blending approach to generate and update images on display screen 140. As a specific example, various embodiments in accordance with the present invention use alpha blending technology. Alpha blending is one process for combining one or more overlay image(s) with a main image, and is useful for blending image elements from separate sources to create a single composite image. The overlay and main images may differ in size, resolution, color-depth, aspect ratio, and the like.

In some embodiments, the transparency or blend factor of the overlay image may be controlled as a percentage that defines the merging of the main image and the overlay image in the overlap region of the two images. Outside the overlap region, the main image is displayed without any modification.

In many cases, the main image and the overlay image are rectangular in shape. In such embodiments, it is still possible to overlay a non-rectangular shaped image using chroma-key technology. Chroma-key allows the system to identify a particular color in the overlay image to be "transparent". When pixels in the overlay image contain the chroma-key value, the parts of the main image overlapped by these pixels are displayed unaltered. Thus, various embodiments may hold an overlay image as a secondary image, hold a background image as a primary image, and use alpha blending to overlay the secondary image onto the primary image.

Embodiments utilizing alpha blending or other blending technology may draw from a variety of blending options. For example, control circuitry 112 may blend a secondary image at different locations to generate multiple, different blended images. The different locations may be with respect to a primary image, the active area of display screen 140, or both. This may be done over time, such as to produce a set of blended images that move the secondary image when shown in sequence. As another example, control circuitry 112 may blend multiple instances of a secondary image at different locations into one blended image. As yet another example, control circuitry 112 may blend multiple instances of a secondary image at different locations into multiple blended images, such as to produce a set of blended images that effectively move the instances of the secondary image.

Embodiments may blend one or more other images in addition to the secondary image. For example, some embodiments may also blend a tertiary image or instances with the tertiary image to form a blended image.

In some embodiments, the primary image is received from host processing system 160 and held in TSCS 110 (e.g. in first memory 131 of FIG. 3). One or more images that may be blended with the primary image can be held in TSCS 110 (e.g. in second memory 132 of FIG. 3). The primary image may be static or may change over a period of time. In some embodiments, the primary image is modified, or replaced entirely by host processing system 160, by TSCS 110 (e.g., using control circuitry 112), or by both.

In some embodiments, an image to be blended with the primary image is smaller than the primary image in physical size, bit size, or the like.

In one embodiment, the secondary image is provided by host processing system 160. In another embodiment, the secondary image is provided by TSCS 110. The secondary image may be modified by host processing system 160, TSCS 110 (e.g., using control circuitry 112), or both. The provision or the adaptation of the secondary image may be in response to user input (e.g., user input detected using touch sensor 150).

In some embodiments, the location at which the secondary (or tertiary or other) image is blended is based on the user input. For example, in response to user input provided by an input object, a secondary image may be blended at a location based on the position of the input object. Specifically, the location may be selected to place the secondary image such that it is overlapped by the input object or offset from the input object. The offset may be static or dynamically determined based on user input factors such as speed, force, duration, and the like. As another example, in response to user input provided by multiple input objects, multiple instances of the secondary image (or the secondary image, a tertiary image, and optionally other images) may be blended at locations based on the positions of the input objects.

In some embodiments, the image(s) selected for blending is based on the user input. For example, a particular image may be associated with a type of user input sequence, and that particular image may be the image blended in response to that type of user input sequence. As another example, a particular image may be associated with a type of input object, and that particular image may be the secondary image in response to user input comprising that type of input object.

Some embodiments accomplish blending by regularly or continuously updating coordinates that specify the location(s) where instance(s) of a secondary image is blended. This approach allows TSCS 110 (e.g., using control circuitry 112) to generate different blended images while allowing the secondary image to remain unchanged in memory.

Embodiments may also change the blend factor over space, over time, or both. For example, some embodiments may increase or decrease the blend factor to fade in or fade out an image. As another example, some embodiments may define different blend factors for different regions of a primary image or display screen active area. When a secondary image is blended in those regions, the associated blend factors are used.

Blended images may also be used to provide pop-ups that enhance user experience. For example, during audio, picture, or video playback, media controls (such as play, pause, fast forward, rewind, volume, back, forward, etc) can pop-up over the imagery displayed. This pop-up functionality may be used for other controls, such as to drawing controls when a drawing program is active, to editing commands when a document editor is active, and the like.

In reference to FIG. 1, this pop-up response may be provided by TSCS 110 (e.g., using control circuitry 112) in response to detection of contact (e.g., taps, touches of particular durations) or non-contact (e.g., stationary or dynamic hover) user input near display screen 140, without involvement of host processing system 160. Thus, some embodiments respond to select non-contact user input with pop-up menus or controls. Such "floating" or "hover-based" tracking feedback in response to user input that is not touching the touch sensor 150 may also be implemented using a blending scheme. In some embodiments, host processing system 160 may become involved when the user interacts with one of the controls shown in the blended image that affects the media displayed.

In various embodiments, the blended image may also be used to provide visual feedback through various icons or other similar images produced responsive to the user input. For example, if a gesture is performed which involves rotating an image, a "rotate" icon can be used as the secondary image and displayed with the primary image without the host processing system's intervention. Meanwhile, host processing system 160 may perform the image processing needed to rotate the image provide updated primary images as needed to perform the rotation.

With reference now to FIG. 3, some embodiments update display screen 140 autonomously in response to user input (e.g., to the drag operation described below) using an embodiment of TSCS that includes first memory 131 and second memory 132, and an embodiment of DCC 120 that includes display refresh circuitry 134, which further includes blended image generator 138 and display screen updater 136. The blended image generator 138 autonomously generates blended images by blending a primary image held in first memory 131 with a secondary image held in secondary memory 132. The display screen updater 136 autonomously updates display screen 140 with the blended images generated by blended image generator 138.

Described below, in reference to FIGS. 1-2 and 5A-7B, are specific examples of operation of specific embodiments of the present invention. FIGS. 5A-7B depict visual feedback on display screen 140 in response to user input detected using touch sensor 150, in accordance to embodiments of the present invention. In various examples, operation of various embodiments the present invention includes operating according to sets of rules that define when control circuitry 112 (1) autonomously updates display screen 140 in response to user input and/or (2) reports information about the user input to host processing system 160.

Referring now to FIG. 5A, a drag operation is depicted, in accordance to an embodiment of the present invention. In general, in response to user input, an image 520A is animated as being dragged along user input path 530A from location 510A to location 514A.

Before the drag operation, control circuitry 112 operates according to a first set of rules. In response to an initiation of the drag operation at location 510A, control circuitry 112 switches from operating according to a first set of rules to operating according to a second set of rules. In some embodiments, control circuitry 112 provides information about the user input that enables host processing system 116 to determine that a drag operation has begun, and provides an indication to control circuitry 112 to switch to operating according to the second set of rules. In some embodiments, control circuitry 112 recognizes that a drag operation has begun, notifies host processing system 116 that the drag operation has begun, and host processing system 116 provides an indication to control circuitry 112 to switch to operating according to the second set of rules.

In this example, the second set of rules defines when control circuitry 112 updates display screen in response to the user input and when control circuitry 112 reports information about the user input to host processing system 160. For example, when operating in accordance with this second set of rules, information about the initiation of a drag operation of image 520A at location 510A (e.g., first type of user input) is reported to host processing system 160 by control circuitry 112 in response to user input that initiates the drag operation. However, information about subsequent drag action (e.g., at least some of the object motion "dragging" image 520A along user input path 530A) is not reported to host processing system 160 in response to the subsequent drag action.

In various embodiments, a set of rules is configured to cause control circuitry 112 to update display screen 140 in response to a first type of user input and not in response to a second type of user input. For example, a particular set of rules may define that, in response to a particular type of user input, that control circuitry 112 autonomously updates display screen 140 in response to that particular type of user input. This particular set of rules may further contain specific rules for not autonomously updating display screen 140 in response to another type of user input, or further lack any rules about updating display screen 140 in response to such user input.

Returning now to FIG. 5A and the example discussed above, the second set of rules associated with this example is configured to cause control circuitry 112 to update display screen 140 in response to parts of the drag sequence. For example, as image 520A is dragged along user input path 530A, display screen 140 is autonomously updated with image 520A at different locations along user input path 530A. Accordingly, image 520A is animated by control circuitry 112 as being dragged along user input path 530A from location 510A to location 514A. As a result of autonomously updating display screen 140, visual feedback latency in response to user input may be reduced.

The following is an example of the drag operation, as described above, with further details relating to the autonomous updating of display screen 140. The example described below utilizes blending technology. Specifically, control circuitry 112 blends of primary image 505A (e.g., a background image) and image 520A (shown as a circular icon) to produce blended images that are used to update display screen 140.

In FIG. 5A, a user input sequence for a drag operation is provided. The input sequence comprises a drag initiation gesture located at location 510A. In response to the drag initiation gesture, host processing system 160 provides an indication to TSCS 110 to operate according to the second set of rules. While operating according to the second set of rules, blended images comprising primary image 505A and image 520A are autonomously generated by control circuitry 112. Furthermore, display screen 140 is autonomously updated by control circuitry 112 with the blended images.

As user input path 530A is traced out by the one or more input objects providing the user input sequence, multiple blended images are autonomously generated by control circuitry 112. These blended images depict image 520A at different locations along (or offset from) user input path 530A. Display screen 140 is autonomously updated by control circuitry 112 with these blended images. For example, when the one or more input objects providing the user input are positioned at location 512A along user input path 530A, a blended image is autonomously generated by control circuitry 112. This blended image locates the secondary image 520A in a position determined by the user input at location 512A, and in front of the primary image 505A. Display screen 140 is autonomously updated with this blended image by control circuitry 112.

Similarly, when the one or more input objects providing the user input sequence is located at location 514A, a blended image is autonomously generated by control circuitry 112 in response to the user input and display screen 140 is autonomously updated with the blended image by control circuitry 112. This blended image locates image 520A in a position determined by the user input at location 514A. In response to movement of the user input, control circuitry 112 repeatedly updates the locations at which image 520A is blended. Control circuitry 112 also repeatedly updates the display screen 140 with the blended images. This moves the secondary image 520A (with respect to primary image 505A, display screen 140, or both).

FIG. 5A depicts the same image 520A being blended with primary image 505A at different parts of the drag function, in accordance to an embodiment of the second set of rules. Other embodiments operating according to other sets of rules may blend different images at different points in time, space, or user input function sequence, in accordance to other sets of rules. For example, in some embodiments, an image indicative of drag initiation may be blended with primary image 505A near location 510A, an image indicative of drag continuation may be blended with primary image 505A at location 512A, or an image indicative of drag termination may be blended with primary image 505A at location 514A.

In some embodiments, primary image 505A changes or is replaced during the drag function.

In some embodiments, in response to a termination of the drag operation, host processing system 160 updates the primary image held in TSCS to include the item that was dragged at a new location determined by the drag operation. For example, after the drag operation shown in FIG. 5A terminates at location 514A, some embodiments update the primary image 505A to include an image of the item dragged (the circular icon that was the secondary image 520A) at the new location 514A. In some embodiments, host processing system 160 performs this updating of the primary image.

With such an approach, the primary image 505A as stored in memory is not corrupted or changed while the blended images depict secondary image 520A being dragged in response to user input.

The secondary image 520A shown is the item that the user is dragging. However, in some embodiments, in accordance to various sets of rules, different images are considered the secondary image and blended for different operations. For example, a blue star may be provided when a drag operation occurs. In contrast, two stacked fingers may be provided in response to another operation, such as a double-tap operation.

In an analogous example, in some embodiments, control circuitry 112 operates touch sensor 150 to detect user input (e.g., comprising a finger hovering over or touching display screen 140 and moving across display screen 140). Control circuitry 112, autonomously updates display screen 140 to provide visual feedback (e.g., a moving cursor, a historical trace, etc.) without requiring intervention by the associated host processing system 160. In some embodiments, host processing system 160 intervenes when the user interacts with an icon or other interactive element shown on display screen 140.

In one embodiment of method 400, autonomously updating display screen 140 when displaying a first portion of an image on display screen 140 comprises detecting a motion of a first user input in the sensing region, determining a second portion of the image to be displayed based on the motion, and updating display screen 140 to display the second portion of the image. A second set of rules can be configured to cause control circuitry 112 to perform these steps.

Figure 5B:
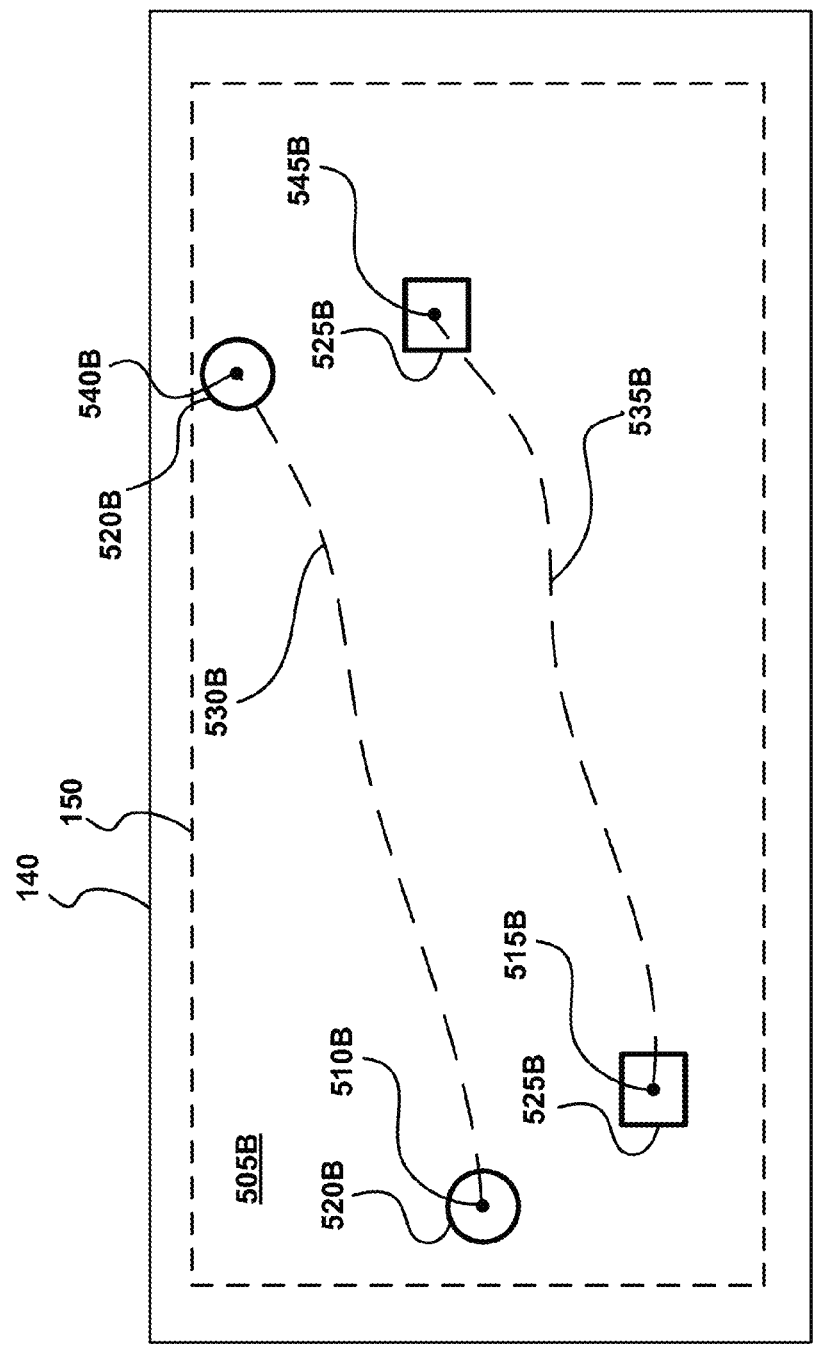
FIGS. 5A-7B illustrates examples of visual feedback provided in response to user input, in accordance with embodiments of the present invention.

For example, referring now to FIG. 5B, a pan operation performed by two input objects (e.g. a two-finger pan operation) is depicted, in accordance to an embodiment of the present invention. In some embodiments, the primary image 505B shown in display screen 140 is a portion of a larger image (e.g., a map, a picture, a text document, a web page). The pan operation depicted in FIG. 5B changes what is shown by display screen 140 to simulate moving a "viewport" over the larger image. In some embodiments, host processing system 160 updates the primary image to provide the simulated motion. In some other embodiments, TSCS holds the larger image in memory, and TSCS 110 (e.g., using control circuitry 112) determines what portion of the larger image to display. For clarity, the changing image is not shown FIG. 5B.

As described above, some embodiments of TSCS 110 may implement viewports autonomously. In some implementations of viewports, TSCS 110 is configured to hold more image data than can be displayed at one time by being physically larger, via compression of image data, or a combination thereof. The compression technology could be highly efficient (e.g., Run-length encoding (RLE)-based compression) or could be lossy (e.g., individual pixel replacement). In some embodiments, during operation, the "viewport" may be the same size or smaller than the physical size of the active area of display screen 140. The "viewport" can be virtually moved over the image, such as in response to user input in the sensing region, and define what image data is displayed on display screen 140.

The following is an example of the pan operation that simulates moving a "viewport", as described above, with further details relating to the blending of primary image 505B and secondary image 520B. Initially, control circuitry 112 operates according to a first set of rules. In response to receiving an indication from host processing system 160, control circuitry 112 switches from operating from a first set of rules to the second set of rules.

As shown in FIG. 5B, to indicate the panning function, secondary image 520B and tertiary image 525B are blended with primary image 505B at locations associated with first and second input objects. As shown, secondary image 520B is associated with a first input object following user input path 530B and tertiary image 525B is associated with a second input object following user input path 435B. Accordingly, the autonomously generated blended image comprises primary image 505B, secondary image 520B and tertiary image 525B. As the input objects move, control circuitry 112 repeatedly generates blended images with the secondary image 520B and tertiary image 525B at locations associated with positions of the input objects, and repeatedly updates display screen 140 with the blended images. Thus, secondary image 520B and tertiary image 525B move in such a way that they appear to follow the input objects along user input paths 530B an 535B.

Figure 5C:
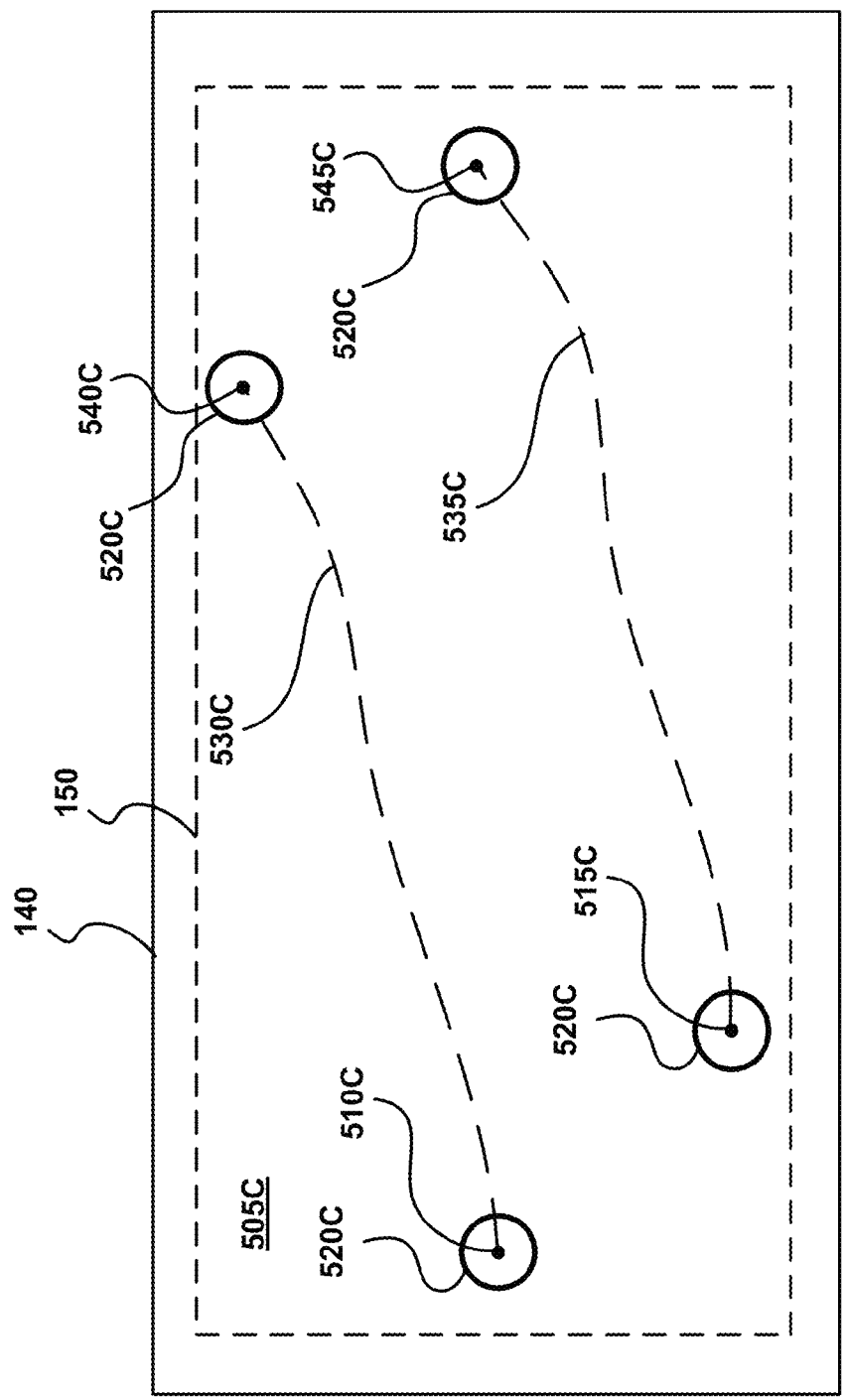

Referring to FIG. 5C, another two-input-object panning operation is depicted, in accordance to an embodiment of the present invention. The operation depicted in FIG. 5C is similar to the operation depicted in FIG. 5B, as described above. However, to indicate the function, a secondary image is blended at two different locations with respect to the primary image. For convenience, they are referred to here as secondary image 520C and copy of secondary image 525C. Secondary image 520C is associated with a first input object following user input path 530C. Similarly, copy of secondary image 525C is associated with a second input object following user input path 535C. Accordingly, the autonomously generated blended image comprises primary image 505C, secondary image 520C and copy of secondary image 525C. As the input objects move, control circuitry 112 repeatedly generates blended images with secondary image 520C and copy of secondary image 525C at different locations with respect to display screen 140 (or another appropriate reference, such as with respect to primary image 505C), and repeatedly updates display screen 140 with the blended images. Thus, secondary image 520C and copy of secondary image 525C appear to move with respect to the primary image 505C and/or display screen 140, and follow the input objects along user input paths 530C and 535C, respectively.

As a specific example, a secondary image may comprise an angle shape. In response to a "pinch" or "spread" user input with input objects moving together or moving apart, respectively, the angle shape may be oriented and located to follow the input object motion. In some embodiments, this can emulate two or more corners of a picture frame, and the expanding or contracting of that picture "frame".

In some embodiments, in accordance to a set of rules, the secondary image is blended to highlight portion(s) of the primary image. In some embodiments, the secondary image is blended at location(s) corresponding to position of user input.

An end to a sequence of user input operations is determined, for example, when the user input comprises one or more input objects lifting away from a surface of the touch sensor 150 or exiting the sensing region. Some embodiments determine the end by determining that user input is no longer sensed in the sensing region of touch sensor 150. In some embodiments, TSCS (e.g., using control circuitry 112) provides an indication of the sequence of user input operations to host processing system 160 in response to the termination of the sequence of user input operations. The indication provided to host processing system 160 may comprise a signal purely indicating the termination, may comprise information about the user input (e.g. gestures recognized, characters inputted, overall motion of input objects comprising the user input, functions selected text entered, etc.), a combination thereof, and the like. In some embodiments, the indication may cause host processing system 160 to switch from a low power state to a full power state, launch or close an application, etc.

In a further embodiment of method 400, control circuitry 112 operates according to a second set of rules when display screen 140 displays a virtual keyboard. An image associated with the virtual keyboard is autonomously updated in response to the user input. In one embodiment, the second set of rules comprises sometimes reporting information about user manipulation of the virtual keyboard to host processing system 160.

Figure 6A:
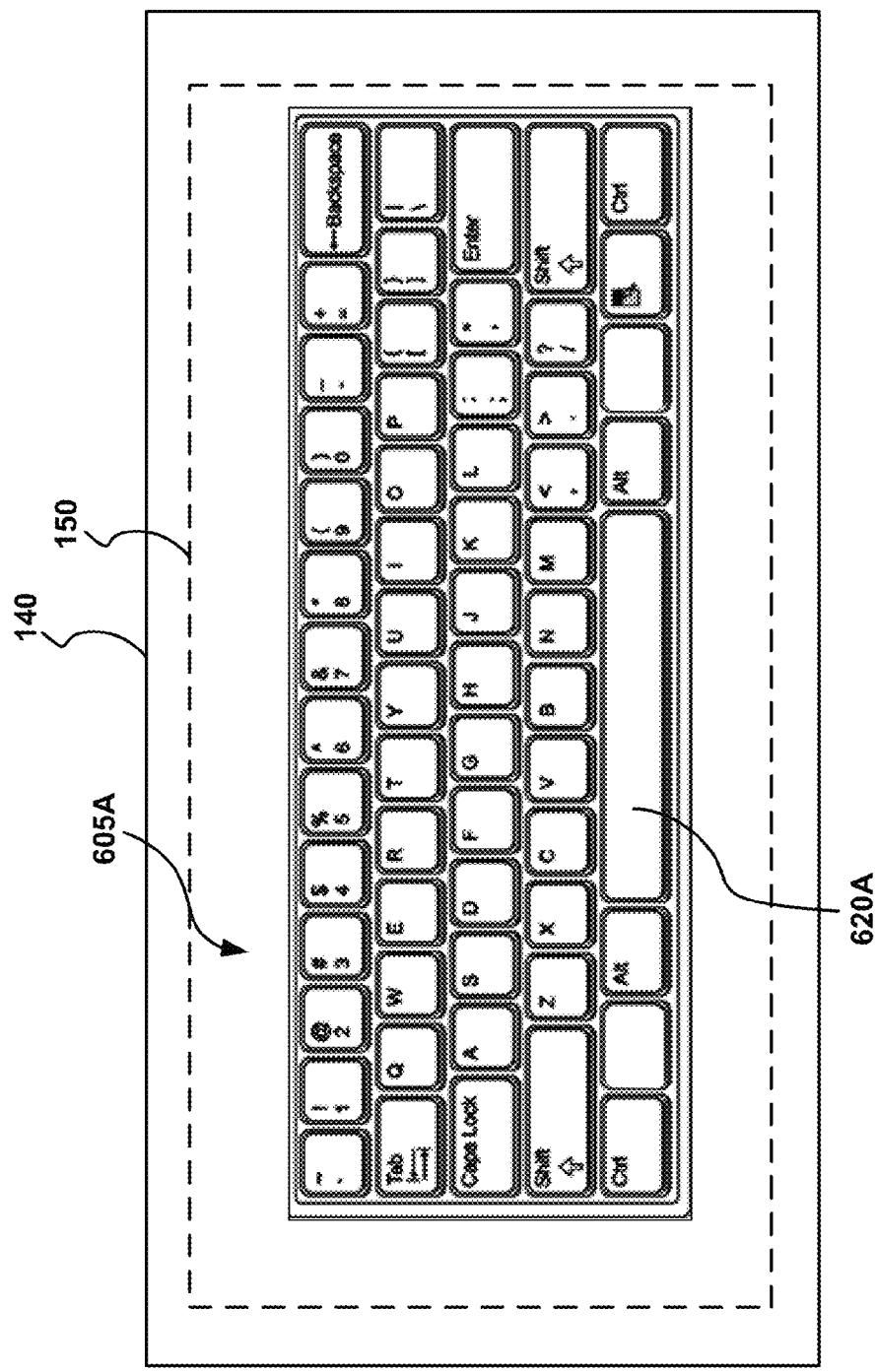
Figure 6B:
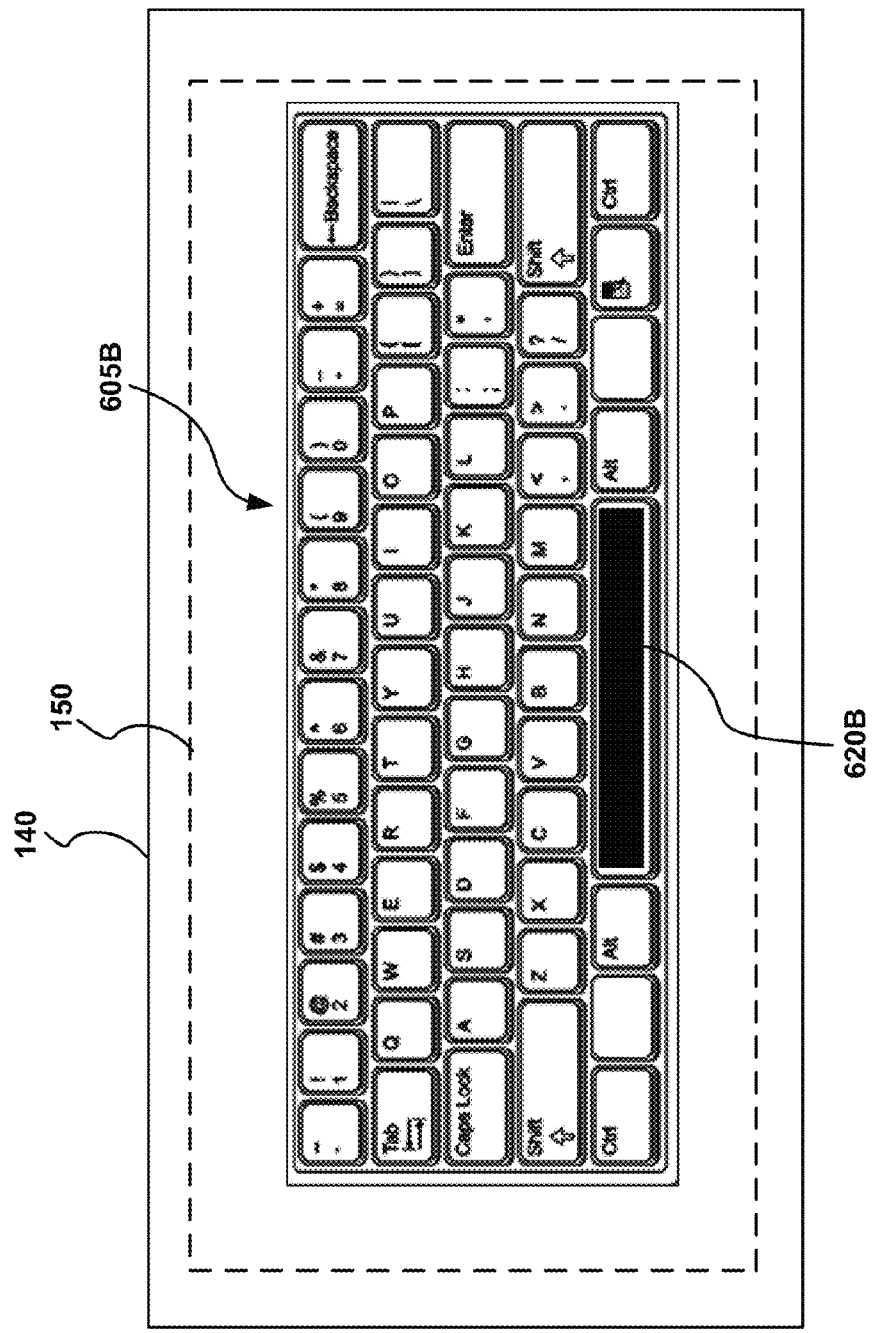

For example, in reference to FIGS. 6A-B, primary image 605A comprises an image of a virtual keyboard. The primary image 605A may be stored in TSCS 110 (e.g. in first memory 131 of FIG. 3). A plurality of key images (e.g., an actuated image of the space bar key image 620A) associated with the virtual keyboard may be stored in TSCS 110 (e.g. in second memory 132 of FIG. 3). User actuation of a key (e.g., space key) of the virtual keyboard based on the user input is determined by TSCS 110 (e.g., using control circuitry 112). An image of the plurality of key images is selected as the image to be blended with the primary image, such that the blended image shows the virtual keyboard with actuation of the selected key.

In particular, as shown in FIGS. 6A-B, user input is provided for actuation of space bar 620A on the virtual keyboard. In response to user input for actuation of space bar 620A, a secondary image 620B of FIG. 6B of an actuated space bar is selected and blended to show the space bar actuated on the virtual keyboard.

In another embodiment of method 400, TSCS 110 blends multiple images with the primary image to generate the blended image. For example, the primary image may comprise an image of a virtual keyboard and the secondary image may comprise a generic key image. In response to user input actuating a key of the virtual keyboard (e.g., "#"), TSCS 110 blends an appropriate, additional image associated the "#" key with the primary and secondary images, such that the blended image shows the virtual keyboard with actuation of the selected key.

In some embodiments, a secondary image may be modified in response to user input by TSCS 110 (e.g., using control circuitry 112), without intervention by host processing system 160. As some examples, the modification may affect the secondary image's size, shape, color, transparency, etc. For example, the primary image may comprise an image of a virtual keyboard and the secondary image may comprise a generic key image. In response to user input actuating a key of the virtual keyboard (e.g., "W"), TSCS 110 modifies the secondary image to place a "W" in an appropriate part of the secondary image, such that the blended image shows the virtual keyboard with actuation of the selected key.

Indicators other than images of actuated keys may be used to provide visual feedback from key actuation. For example, referring to FIGS. 6A-B, a highlighter comprising a colored rectangle may be the secondary image 620B blended with the primary image 620A to provide visual feedback of actuation. In some embodiments the same highlighter (modified or not modified by TSCS 110) is used for multiple keys.

Highlighting of keys may be used to indicate which key(s) would be actuated if a selection input was provided, instead or in addition to indicating key actuation (s). For example, non-contact user input that hovers over an area associated with the "Q" key for more than a reference amount of time may cause the "Q" key to highlight. Contact user input may then cause actuation of the "Q" key and entry of "Q" into a memory buffer.

Figure 7A:
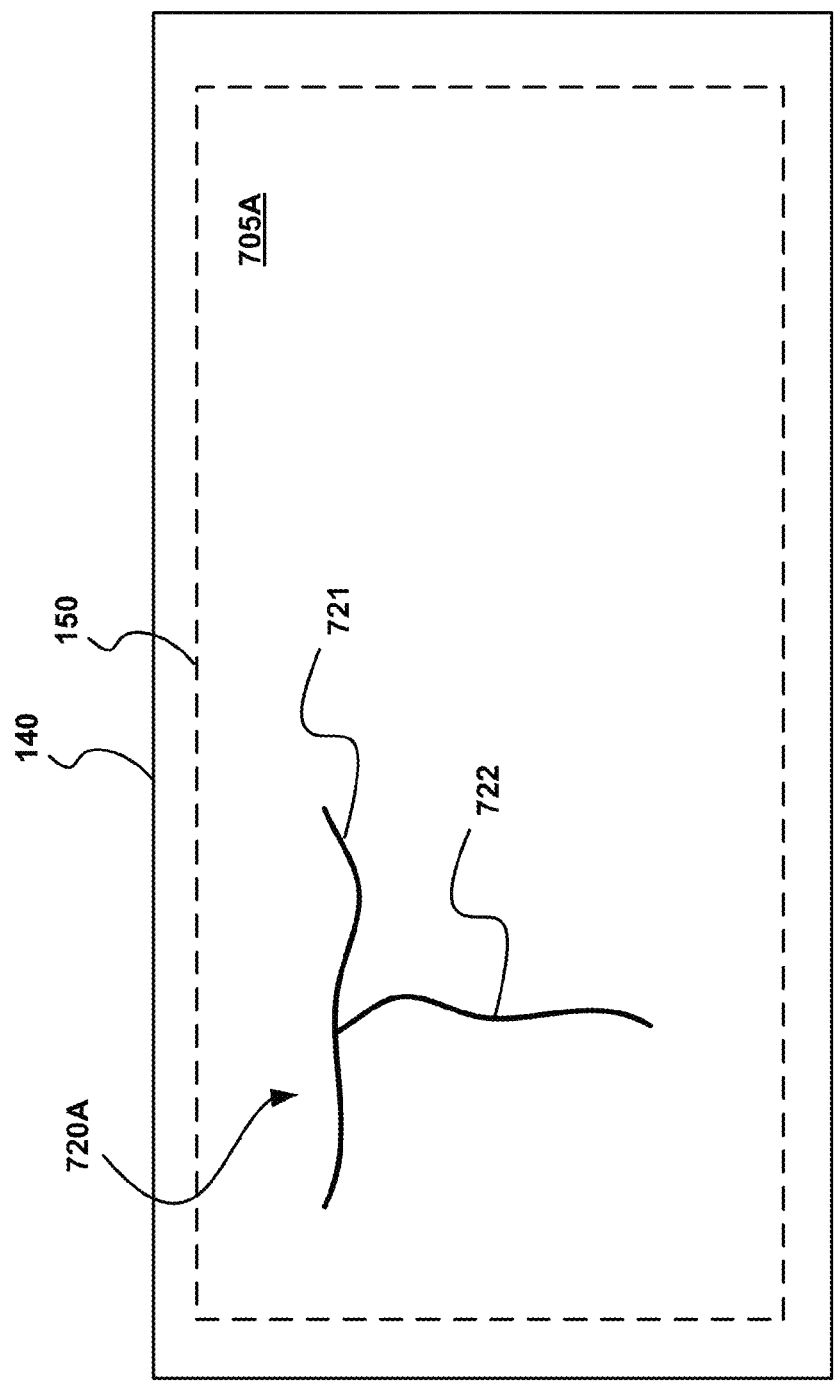
Figure 7B:
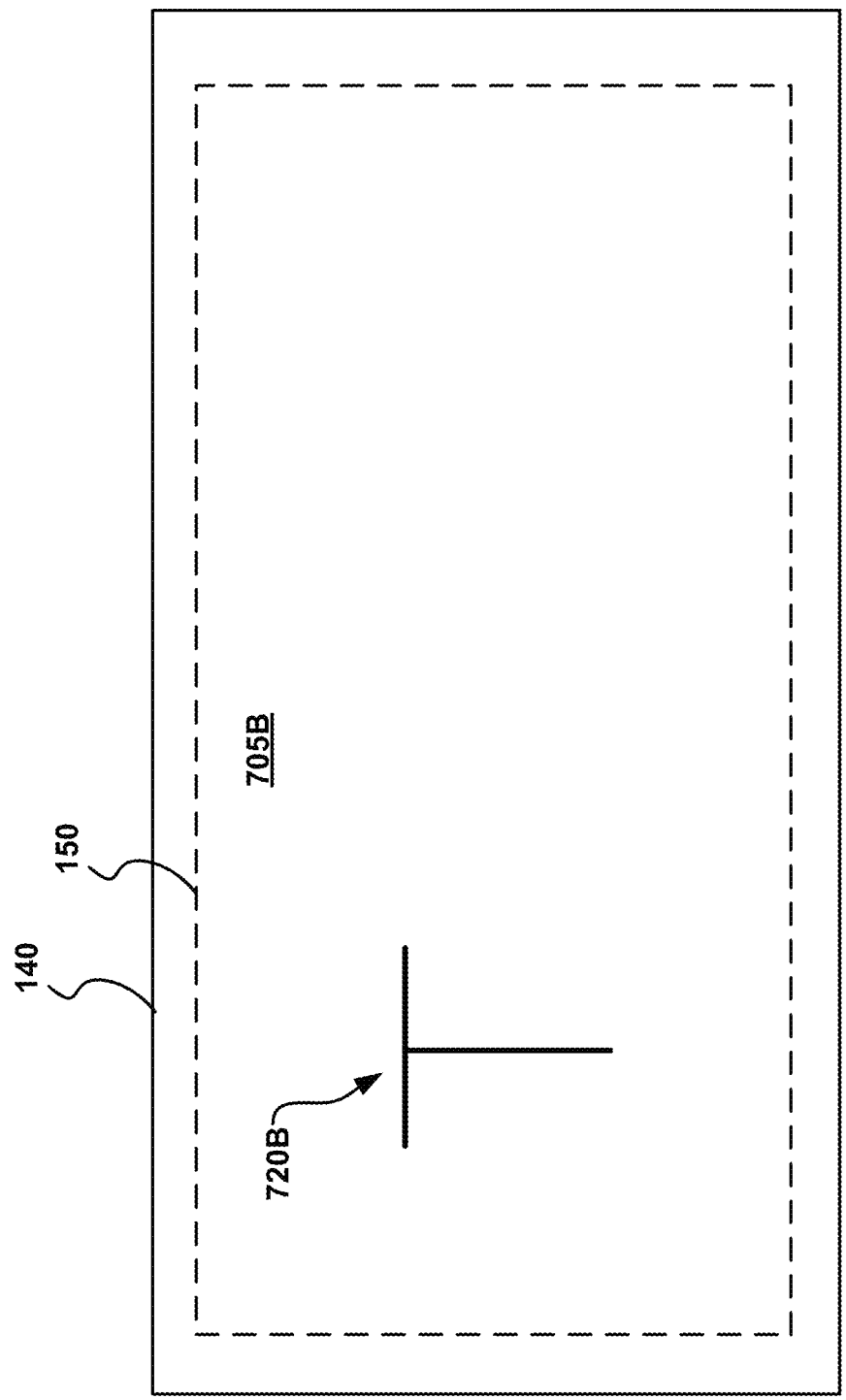

In one embodiment of method 400, in reference to FIGS. 7A-B, control circuitry 112 operates according to a second set of rules. The second set of rules comprises autonomously updating display screen 140 to display a trace of a movement of the user input, in response to the movement. For example, TSCS 110 modifies secondary image 720A such that it comprises inking associated with movement of the user input.

In particular, a user input of a handwritten letter "T" is provided in FIGS. 7A-B. As the handwritten letter "T" is created by the user input along user input paths 721 and 722, TSCS 110 (e.g., using control circuitry 112) in accordance to the second set of rules, modifies the secondary image to match. Thus, the blended images that are autonomously generated and used to update display screen 140 inks along the handwritten letter "T". That is, the repeated blending of primary image 705A and the adapted secondary image 720A shows inking. Furthermore, in some embodiments, when the user's input of the handwritten letter "T" is recognized as the letter "T," the handwritten letter "T" is replaced with a typed letter "T" on display screen 140.

In various embodiments, host processing system 160 of FIG. 1 downloads character recognition code into TSCS 110. TSCS 110 (e.g., using control circuitry 112) implements most or the entire character recognition functionality. This can include low-latency stroke drawing, haptic feedback, and dictionary correction, and the like. A standard handwriting or keypad input interface can be used for communicating with host processing system 160. Host processing system 160 can configure character recognition functionality by downloading different code, for different languages, character sets, etc.

In another embodiment of method 400, TSCS 110 (e.g., using control circuitry 112) provides indication to host processing system 160 that triggers host processing system 160 to be in a low power state during. In various embodiments, the indication comprises user input information, from which host processing system 160 determines that it may enter a low power state. In some embodiments, the indication comprises a signal specifically to indicate to host processing system 160 that it may enter a low power state. In another embodiment, the indication occurs during at least part of the generating an image (e.g. a blended image) and updating display screen 140 with the image.

For example, in some embodiments, a set of rules may provide that TSCS trigger host processing system 160 to be in a low power state once it is determined that the drag operation has initiated.

In another embodiment, host processing system 160 provides software and rules to implement a complete nested menu GUI to TSCS 110. The user can navigate through the nested menu structure without any intervention from host processing system 160. TSCS 110 (e.g., using control circuitry 112) renders the menus and host processing system 160 can go into a lower power state. When the user makes a menu selection, the processing system 160 is awakened if necessary and the processing responsibility is transferred back to processing system 160 as appropriate.

In various embodiments, host processing system 160 is configured for providing the indication that is configured to cause control circuitry 112 to switch to operating according to a second set of rules in response to a first application running on host processing system 160. In some embodiments, host processing system 160 is further configured for providing a second indication in response to a second application running on host processing system 160. The second indication is configured to cause control circuitry 112 to switch to operating according to the first set of rules.

For example, in some embodiments, when a word processing application is running on host processing system 160, host processing system 160 provides an indication to cause control circuitry 112 to switch to operating according to a second set of rules. Similarly, when a web browser is running on host processing system 160, host processing system 160 provides an indication to cause control circuitry 112 to switch to operating according to a first set of rules.

In some embodiments, host processing system 160 is configured for providing the indication in response to a first application running on host processing system 160 and having priority over any other application running on said host processing system 160, and providing a second indication in response to a second application running on host processing system 160 and having priority over any other application running on host processing system 160. The indication is configured to cause control circuitry 112 to switch to operating according to a second set of rules. The second indication is configured to cause control circuitry 112 to switch to operating according to the first set of rules.

For example, in some embodiments where a word processing application and a web browser are both running on host processing system 160, the word processing application may have the focus sometimes, and the web browser may have the focus sometimes. The web browser has focus or priority over the word processing application when the user is actively using the web browser. Similarly, the word processing application has focus or priority over the web browser when the user is actively using the word processing application.

If the word processing application has focus or priority over the web browser (or any other application running on host processing system 160), then host processing system 160 provides a first indication. If the web browser subsequently has focus or priority over the word processor (or any other application running on host processing system 160), then host processing system 160 provides a second indication. The first indication is configured for causing control circuitry 112 to switch to operating according to a second set of rules specific to the word processing application. The second indication causing control circuitry 112 to switch to operating according to a first set of rules specific to the web browser. The word processing and web browser are example applications, and any number and type of applications may run on host processing system 160

Moreover, TSCS 110 may provide an interpretation of the user input as part of its communication with the host processor when operating according to some sets of rules. The interpretive function of TSCS 110 can be made reconfigurable or application specific. In some embodiments, TSCS 110 (e.g. using control circuitry 112) does not report every instance of user input to host processing system 160, but rather only those instances of user input that are significant or relevant to the application being processed at a given time.

In some embodiments, host processing system 160 is configured for providing the indication when a first image is displayed on display screen 140, and for providing a second indication when a second image is displayed on display screen 140. The indication is configured for causing control circuitry 112 to switch to operating according to a second set of rules specific to the first image. The second indication is configured to cause control circuitry 112 to switch to operating according to a first set of rules specific to the second image.

For example, in some embodiments of FIG. 5A, if primary image 505A is an image of a software application, then host processing system 160 provides an indication such that control circuitry 112 operates according to a set of rules (e.g., a second set of rules). If primary image 505A is an image of a dialog box (e.g., a search dialog) of that software application, then host processing system 160 provides an indication such that control circuitry 112 operates according to another set of rules (e.g., a first set of rules).

In various embodiments of the present invention, various devices other than display screen 140 provide feedback to the user. In one embodiment, a haptic actuator (not shown) is controlled by device control module 125 (show in FIG. 3) and provides haptic feedback to the user, in accordance to a set of rules. As a result of the haptic feedback, a user's sense of comfort and confidence in electrical device 100 of FIG. 1 is enhanced. In one example, the haptic actuator provides tactile feedback such as a physical resistance or a non-linear mechanical response to user input. In another example, the haptic actuator provides a buzzing or a vibratory response to user input. Other devices may be utilized that provide aural feedback via clicks, pings, thuds, or other sounds.

Moreover, alternate or additional components, such as other interface or feedback devices may be utilized. These alternate or additional devices include microphones, speakers and other audio devices, force sensors, motion sensors, accelerometers, gyroscopes, optical detectors, imaging devices, mechanical buttons, latches, levers, sliders and the like.

In various embodiments of the present invention, electronic device 100 includes a security function without requiring intervention by host processing system 160, in accordance to a set of rules. In one embodiment, electronic device 100 is unlocked, in response to sensing user input in a sensing region overlapping an active area of said display screen 140. TSCS 110 may not allow host processing system 160 to power up or allow electronic device 100 to accept other input until electronic device 100 is unlocked.

In another embodiment, in response to a failed attempt to unlock electronic device 100, a secondary image configured for responding to a failed attempt to unlock electronic device 100 is displayed on display screen 140.

In various embodiments, TSCS 110 holds secure passwords and encryption keys in a protected area of its memory that cannot be read out by host processing system 160. In accordance to a set of rules, TSCS 110 (e.g., using control circuitry 112) displays an on-screen, virtual keypad that allows users to enter passwords. TSCS 110 then compares user input via the keypad to one or more passwords held in memory. If the password is correct, TSCS 110 releases an encryption key to host processing system 160. Because host processing system 160 is not involved in the holding or entry of the password, malicious software running on host processing system 160 cannot snoop on the holding and/or entry of the password.

Various embodiments of the present invention are thus described. While the present invention has been described in particular embodiments, it should be appreciated that the present invention should not be construed as limited by such embodiments, but rather construed according to the following claims.

What is claimed is:

1. A touch screen control system configured to communicate with a host processing system, said touch screen control system comprising:
   a memory; and
   control circuitry configured to operate a touch screen comprising a touch sensor and a display screen according to rules stored in said memory by:
      during a first time period and in response to detecting a first type of user input with said touch sensor, updating said display screen autonomously and without requiring intervention from said host processing system following said detection of said first type of user input;
      during said first time period and in response to detecting a second type of user input with said touch sensor, updating said display screen according to directions provided by said host processing system, wherein said second type of user input is different than said first type of user input, and wherein each of said first type of input and said second type of input involve at least one physical input object interacting with a sensing region of said touch sensor; and
      during a second time period and in response to detecting said first type of user input with said touch sensor, updating said display screen according to directions provided by said host processing system.

2. The touch screen control system of claim 1, wherein said control circuitry is further configured to:
   during said second time period and in response to detecting said second type of user input with said touch sensor, updating said display screen according to directions provided by said host processing system.

3. The touch screen control system of claim 1, wherein said touch screen control system comprises:
   display control circuitry for updating said display screen; and
   touch sensor control circuitry for operating said touch sensor and configured for direct communications with said display control circuitry.

4. The touch screen control system of claim 3, wherein said display control circuitry and said touch sensor control circuitry share processing circuitry.

5. The touch screen control system of claim 3, wherein said display control circuitry and said touch sensor control circuitry form a same IC.

6. The touch screen control system of claim 3, wherein said display control circuitry and said touch sensor control circuitry comprise separate ICs.

7. The touch screen control system of claim 1, wherein said control circuitry is further configured to
   during said first time period, not report a selected part of an input sequence even as said control circuitry autonomously updates said display screen in response to said selected part of said input sequence.

8. The touch screen control system of claim 7, wherein said control circuitry is configured to not report a selected part of said input sequence even as said control circuitry autonomously updates said display screen in response to said selected part of said input sequence by:
   not reporting an intervening part of said input sequence even as said control circuitry autonomously updates said display screen in response to said intervening part of said input sequence, said intervening part of said input sequence being between an initiation and a termination of said input sequence.

9. The touch screen control system of claim 7, wherein said control circuitry is further configured to provide an indication to said host processing system to enter a low power state in response to detecting an initiation of said input sequence.

10. The touch screen control system of claim 7, wherein said control circuitry is further configured to provide an indication to said host processing system to enter a full power state in response to detecting a termination of said input sequence.

11. The touch screen control system of claim 1, wherein said first type of user input is a drag operation, and wherein said control circuitry is further configured to:
   in response to an initiation of said drag operation, initiate said first time period.

12. The touch screen control system of claim 11, wherein said control circuitry is further configured to:
   in response to a termination of said drag operation, end said first time period.

13. The touch screen control system of claim 11, wherein said control circuitry is further configured to
   during said first time period, not report an intervening part of said drag operation even as said control circuitry autonomously updates said display screen in response to said intervening part of said drag operation, said intervening part of said drag operation being between an initiation and a termination of said drag operation.

14. A method of operating a touch screen control system for an electronic device comprising a touch sensor and a display screen overlapped with a sensing region of said touch sensor, said method comprising:
   during a first time period and in response to detecting a first type of user input with said touch sensor, updating said display screen autonomously and without requiring intervention from a host processing system following said detection of said first type of user input;
   during said first time period and in response to detecting a second type of user input with said touch sensor, updating said display screen according to directions provided by a host processing system, wherein said second type of user input is different than said first type of user input, and wherein each of said first type of input and said second type of input involve at least one physical input object interacting with said sensing region of said touch sensor; and
   during a second time period and in response to detecting said first type of user input with said touch sensor, updating said display screen according to directions provided by said host processing system.

15. The method of claim 14, wherein said first type of user input comprises an input sequence, the method further comprising:

during said first time period, not reporting an intervening part of said input sequence even as said display screen is autonomously updated in response to said intervening part of said input sequence, said intervening part of said input sequence being between an initiation and a termination of said input sequence.

16. The method of claim 14, further comprising:
providing an indication to said host processing system to enter a low power state before said first time period.

17. The method of claim 14, further comprising:
providing an indication to said host processing system to enter a full power state after said first time period.

18. The method of claim 14, wherein said first type of user input is a drag operation, further comprising:
in response to an initiation of said drag operation, initiating said first time period; and
in response to a termination of said drag operation, terminating said first time period.

19. A handheld computing device comprising:
a touch screen comprising a touch sensor and a display screen;
a host processing system; and
a touch screen control system configured to communicate with said host processing system, said touch screen control system comprising:
a memory; and
control circuitry configured to operate said touch screen according to rules stored in said memory by:
during a first time period and in response to detecting a first type of user input with said touch sensor, updating said display screen autonomously and without requiring intervention from said host processing system following said detection of said first type of user input;
during said first time period and in response to detecting a second type of user input with said touch sensor, updating said display screen according to directions provided by said host processing system, wherein said second type of user input is different than said first type of user input, and wherein each of said first type of input and said second type of input involve at least one physical input object interacting with a sensing region of said touch sensor; and
during a second time period and in response to detecting said first type of user input with said touch sensor, updating said display screen according to directions provided by said host processing system.

20. The handheld computing device of claim 19, wherein said control circuitry is further configured for:
during said second time period and in response to detecting said second type of user input with said touch sensor, updating said display screen according to directions provided by said host processing system.

* * * * *